US012781346B2

(12) United States Patent
Yap et al.

(10) Patent No.: US 12,781,346 B2
(45) Date of Patent: Nov. 3, 2026

(54) HYBRID SHOWERHEAD WITH SEPARATE FACEPLATE FOR HIGH TEMPERATURE PROCESS

(71) Applicant: LAM RESEARCH CORPORATION, Fremont, CA (US)

(72) Inventors: Lipyeow Yap, San Jose, CA (US); Panya Wongsenakhum, Fremont, CA (US); Nivin Vikraman, Bangalore (IN); Gary B. Lind, Penn Valley, CA (US)

(73) Assignee: LAM RESEARCH CORPORATION, Fremont, CA (US)

(*) Notice: Subject to any disclaimer, the term of this patent is extended or adjusted under 35 U.S.C. 154(b) by 847 days.

(21) Appl. No.: 18/025,197

(22) PCT Filed: Sep. 9, 2021

(86) PCT No.: PCT/US2021/049556
§ 371 (c)(1),
(2) Date: Mar. 8, 2023

(87) PCT Pub. No.: WO2022/060615
PCT Pub. Date: Mar. 24, 2022

(65) Prior Publication Data

US 2024/0295026 A1 Sep. 5, 2024

Related U.S. Application Data

(60) Provisional application No. 63/079,530, filed on Sep. 17, 2020.

(51) Int. Cl.

*C23C 16/455* (2006.01)
*C23C 16/44* (2006.01)

(52) U.S. Cl.

CPC .... *C23C 16/45565* (2013.01); *C23C 16/4404* (2013.01); *C23C 16/4412* (2013.01);
(Continued)

(58) Field of Classification Search

CPC .......... C23C 16/45565; C23C 16/4404; C23C 16/4412; C23C 16/45561; C23C 16/4557;
(Continued)

(56) References Cited

U.S. PATENT DOCUMENTS 5,595,606 A * 1/1997 Fujikawa .......... C23C 16/45572 118/724
7,452,827 B2 * 11/2008 Gianoulakis ........ C23C 16/4412 438/778
(Continued)

FOREIGN PATENT DOCUMENTS

CN 109234708 B * 6/2022 ......... C23C 16/5096
CN 120183995 A * 6/2025 ....... H01L 21/67069
(Continued)

OTHER PUBLICATIONS

International Search Report and Written Opinion of the ISA issued in PCT/US2021/049556, mailed Dec. 21, 2021; ISA/KR.
(Continued)

*Primary Examiner* — Jeffrie R Lund

(57) ABSTRACT

A showerhead for a processing chamber comprises a metal plate attached to the processing chamber, a ceramic faceplate attached to the metal plate and including a plurality of gas outlets on a substrate-facing surface, and a metal ring surrounding the ceramic faceplate and attached to the processing chamber.

37 Claims, 22 Drawing Sheets

(52) U.S. Cl.
CPC .... *C23C 16/45561* (2013.01); *C23C 16/4557* (2013.01); *C23C 16/45572* (2013.01); *C23C 16/45574* (2013.01)

(58) Field of Classification Search
CPC ........ C23C 16/45572; C23C 16/45574; C23C 16/45544; C23C 16/52
See application file for complete search history.

(56) References Cited

U.S. PATENT DOCUMENTS

| | | | | |
|---|---|---|---|---|
| 9,057,128 | B2 * | 6/2015 | Olgado | C23C 16/45572 |
| 9,824,884 | B1 * | 11/2017 | Sims | C23C 16/4405 |
| 10,755,900 | B2 * | 8/2020 | Tran | C23C 16/45565 |
| 10,808,317 | B2 * | 10/2020 | Chandrasekharan | C23C 16/509 |
| 11,049,698 | B2 * | 6/2021 | Lubomirsky | H01J 37/32091 |
| 2012/0011096 | A1 | 1/2012 | Aggarwal | |
| 2012/0222616 | A1 * | 9/2012 | Han | C23C 16/45574 239/548 |
| 2014/0203702 | A1 * | 7/2014 | Amikura | H01J 37/32091 313/231.31 |
| 2015/0004798 | A1 * | 1/2015 | Chandrasekharan | H01L 21/67017 438/758 |
| 2015/0011096 | A1 * | 1/2015 | Chandrasekharan | C23C 16/45565 239/289 |
| 2017/0335457 | A1 | 11/2017 | Nguyen et al. | |
| 2018/0087155 | A1 * | 3/2018 | Subramani | C23C 28/42 |
| 2018/0096865 | A1 * | 4/2018 | Lubomirsky | H01J 37/3244 |
| 2019/0226087 | A1 | 7/2019 | Zhang et al. | |
| 2025/0246411 | A1 * | 7/2025 | Chen | H01L 21/02274 |
| 2026/0062808 | A1 * | 3/2026 | Hong | C23C 16/45565 |

FOREIGN PATENT DOCUMENTS

| | | | | | |
|---|---|---|---|---|---|
| EP | 3919463 | A1 | * | 12/2021 | C04B 37/005 |
| JP | H0273624 | A | | 3/1990 | |
| JP | 2007273747 | A | | 10/2007 | |
| JP | 2008001923 | A | | 1/2008 | |
| JP | 4256212 | B2 | * | 4/2009 | H01J 40/16 |
| JP | 2011503845 | A | | 1/2011 | |
| JP | 2014143101 | A | | 8/2014 | |
| JP | 2015010281 | A | | 1/2015 | |
| JP | 2018190983 | A | | 11/2018 | |
| JP | 102020088317 | A | | 6/2020 | |
| JP | 7126431 | B2 | * | 8/2022 | H01L 21/67126 |
| JP | 2023502597 | A | * | 1/2023 | C04B 41/0081 |
| JP | 2024046742 | A | * | 4/2024 | H01J 37/3244 |
| KR | 20110054840 | A | * | 5/2011 | C23C 16/45536 |
| KR | 1020110054840 | A | | 5/2011 | |
| TW | 201516177 | A | | 5/2015 | |
| TW | 202034364 | A | | 9/2020 | |

OTHER PUBLICATIONS

Japanese Notice of Reasons for Refusal for Japanese Application No. 2023-516060 dated Sep. 24, 2025.
Taiwanese Office Action for Taiwanese Application No. 110134150 dated Jul. 28, 2025.

* cited by examiner

FIG. 2C
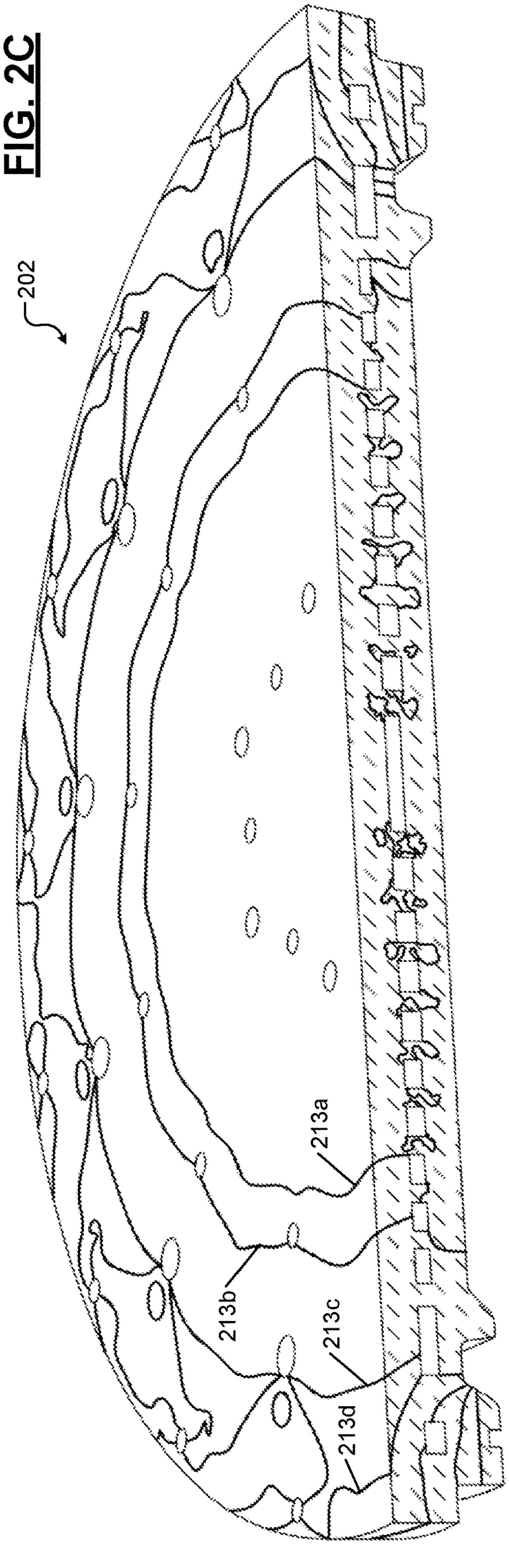
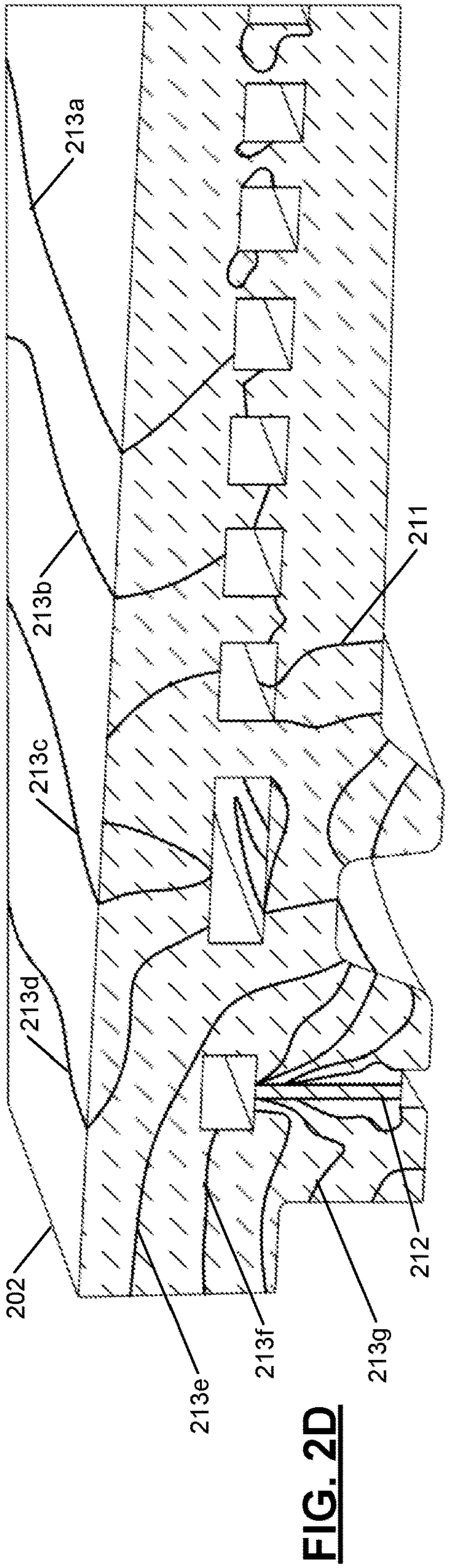
FIG. 2D

HYBRID SHOWERHEAD WITH SEPARATE FACEPLATE FOR HIGH TEMPERATURE PROCESS

CROSS-REFERENCE TO RELATED APPLICATIONS

This application is a U.S. National Phase Application under 35 U.S.C. 371 of International Application No. PCT/US2021/049556, filed on Sep. 9, 2021, which claims the benefit of U.S. Provisional Application No. 63/079,530, filed on Sep. 17, 2020. The entire disclosures of the applications referenced above are incorporated herein by reference.

FIELD

The present disclosure relates generally to substrate processing systems and more particularly to a hybrid showerhead with a separate faceplate for high temperature processes.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Atomic Layer Deposition (ALD) is a thin-film deposition method that sequentially performs a gaseous chemical process to deposit a thin film on a surface of a material (e.g., a surface of a substrate such as a semiconductor wafer). Most ALD reactions use two chemicals called precursors (reactants) that react with the surface of the material one precursor at a time in a sequential, self-limiting manner. Through repeated exposure to separate precursors, a thin film is gradually deposited on the surface of the material.

Thermal ALD (T-ALD) is carried out in a heated processing chamber. The processing chamber is maintained at a sub-atmospheric pressure using a vacuum pump and a controlled flow of an inert gas. The substrate to be coated with an ALD film is placed in the processing chamber and is allowed to equilibrate with the temperature of the processing chamber before starting the ALD process.

SUMMARY

A showerhead for a processing chamber comprises a metal plate attached to the processing chamber, a ceramic faceplate attached to the metal plate and including a plurality of gas outlets on a substrate-facing surface, and a metal ring surrounding the ceramic faceplate and attached to the processing chamber.

In another feature, the ceramic faceplate has a smaller diameter than the metal plate.

In another feature, an outer diameter of the metal ring is the same as a diameter of the metal plate.

In another feature, the ceramic faceplate has a smaller diameter than a diameter of the metal plate and an outer diameter of the metal ring.

In another feature, an inner edge of the metal ring contacts an outer edge of the ceramic faceplate.

In other features, the ceramic faceplate includes a first flange extending radially outwardly from a base portion of the ceramic faceplate. The metal ring includes a second flange extending radially inwardly from an inner edge of the metal ring. The second flange is arranged on the first flange.

In another feature, the metal ring is attached to the metal plate.

In another feature, the metal ring is integrated with the metal plate.

In other features the metal ring contacts the metal plate. The metal ring includes a recess on a surface contacting the metal plate.

In another feature, the metal plate includes a recess on a surface contacting the ceramic faceplate proximate to an outer edge of the ceramic faceplate.

In other features, the metal ring is attached to the metal plate and includes a first recess on an upper surface contacting the metal plate. The metal plate includes a second recess on a lower surface contacting the ceramic faceplate proximate to an outer edge of the ceramic faceplate.

In another feature, the metal plate includes a manifold that is in fluid communication with the processing chamber via an outer edge of the ceramic faceplate and an inner edge of the metal ring.

In other features, the metal plate includes a manifold. An interface between the metal ring and the ceramic faceplate controls flow of an exhaust gas from the processing chamber to the manifold.

In other features, the metal plate includes a manifold that is in fluid communication with the processing chamber and an outlet in fluid communication with the manifold to exhaust a gas from the processing chamber.

In other features, the metal plate includes a manifold. The manifold includes a plurality of through holes in fluid communication with the processing chamber.

In another feature, the manifold receives an inert gas. The inert gas flows via the plurality of through holes into the processing chamber.

In another feature, the manifold receives an exhaust gas via the plurality of through holes from the processing chamber.

In other features, the metal plate includes a manifold. A first portion of the manifold exhausts a first gas from the processing chamber. A second portion of the manifold supplies a second gas to the processing chamber.

In other features, the metal plate includes a manifold, an outlet connected to a first portion of the manifold, and an inlet connected to a second portion of the manifold that is separate from the first portion. A first set of holes in the first portion of the manifold to exhaust via the outlet a first gas received from the processing chamber through an interface between the ceramic faceplate and the metal ring. A second set of holes in the second portion of the manifold to supply a second gas received from the inlet to the processing chamber.

In another feature, the metal ring includes a plurality of through holes in fluid communication with the second set of holes in the second portion of the manifold and with the processing chamber.

In other features, the ceramic faceplate comprises a base portion including the gas outlets arranged around a plurality of concentric channels formed by walls extending vertically from the base portion. The ceramic faceplate comprises an upper portion arranged on the base portion, the upper portion contacting the walls and including one or more inlets to receive a gas. The gas outlets in the ceramic faceplate disperse the gas into the processing chamber.

In other features, the showerhead further comprises a gas inlet connected to the metal plate, and an adapter attached to the gas inlet and the one or more inlets of the ceramic faceplate.

In other features, the metal plate includes a slot. The adapter is arranged in the slot and includes one or more segments that respectively couple to the one or more inlets of the ceramic faceplate.

In other features, the slot is arranged at a center of the metal plate. The one or more segments of the adapter extend radially outwardly from the center.

In other features, the showerhead further comprises a gas inlet connected to a center of the metal plate, the metal including a slot at the center in fluid communication with the gas inlet. The showerhead further comprises an adapter arranged in the slot and including one or more segments that are in fluid communication with the gas inlet, that extend radially outwardly from the center, and that respectively couple to the one or more inlets of the ceramic faceplate.

In other features, the showerhead further comprises a first plate including a heater and arranged on the metal plate, and a second plate including a cooling channel and arranged on the first plate.

In another feature, the metal ring is plated with an anti-corrosive material.

In another feature, the metal plate and the metal ring are plated with an anti-corrosive material.

In another feature, the walls are plated with an anti-corrosive material.

In other features, a system comprises the showerhead and a pedestal, and the metal ring contacts the pedestal.

In another feature, the metal ring isolates the ceramic faceplate from the pedestal.

In other features, the system further comprises a gas source to supply a gas to the showerhead, and the gas is dispersed into the processing chamber through the plurality of gas outlets of the ceramic faceplate of the showerhead.

In another feature, the system further comprises a fluid delivery system to supply a coolant to at least one of the showerhead and the pedestal.

In another feature, at least one of the showerhead and the pedestal comprises one or more heaters.

In another feature, the system further comprises a vacuum pump connected to the processing chamber.

In another feature, the system further comprises a gas source connected to the processing chamber to supply an inert gas to the processing chamber.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 2C shows temperature gradients in the ceramic faceplate of the showerhead of FIG. 2A;

FIG. 2D shows an example of stress concentration near an origin of a fracture in the ceramic faceplate of the showerhead of FIG. 2A caused by the temperature gradients shown in FIG. 2C;

In the drawings, reference numbers may be reused to identify similar and/or identical elements.

DETAILED DESCRIPTION

Figure 1:
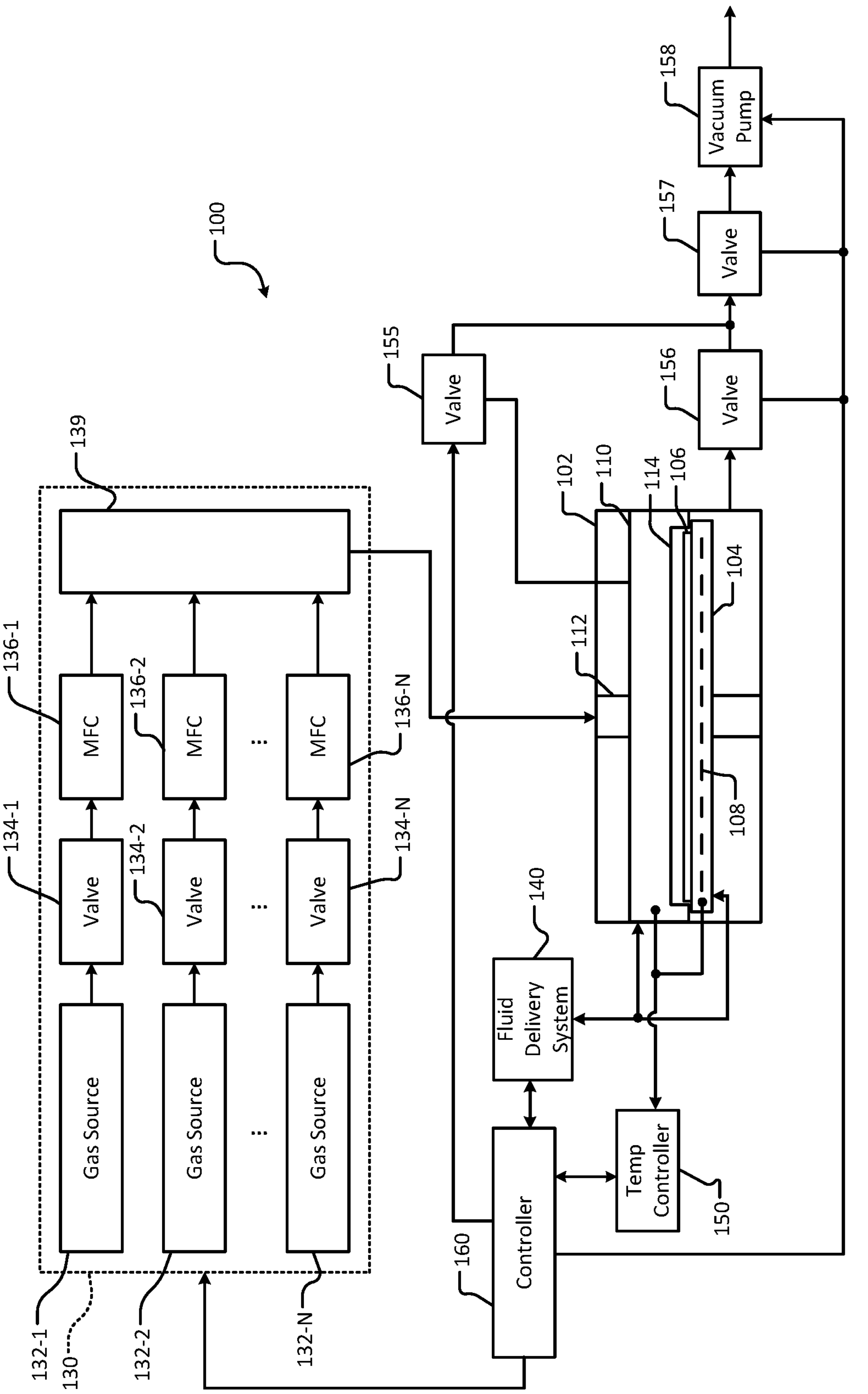
FIG. 1 shows an example of a substrate processing system that includes a processing chamber comprising a showerhead designed according to the present disclosure.

Most showerheads are made of a metal such as Aluminum. Some showerheads may include a ceramic faceplate mounted on a backing plate made of a metal such as Aluminum for thermal control. The ceramic faceplate is typically of the same size (diameter) as the backing plate. Consequently, the ceramic faceplate directly contacts a top plate of a process module. The top plate is metallic and relatively cold, and has a very different coefficient of thermal expansion (CTE) than the ceramic faceplate. Additionally, a bottom portion of the ceramic faceplate near an outer diameter (OD) of the ceramic faceplate is at a close spatial distance from a pedestal in the processing chamber and is subjected to a heat load of the pedestal during substrate processing. Accordingly, a portion of the ceramic faceplate near the OD has a relatively high temperature gradient that can cause fractures near the OD of the ceramic faceplate as explained below in further detail.

The present disclosure provides a showerhead design that reduces the diameter of the ceramic faceplate, and adds a metal (e.g., Aluminum) ring around the ceramic faceplate. The metal ring decouples the ceramic faceplate from the top plate and from the thermal load of the pedestal. The metal ring provides a thermal break between the ceramic faceplate and the top plate. Instead of the ceramic faceplate, the metal ring is subjected to the heat load of the pedestal. The thermal break introduced at the OD of the ceramic faceplate thermally isolates the ceramic faceplate from the cooling effects of the top plate near the edge of the ceramic faceplate.

Due to the smaller diameter of the ceramic faceplate and due to the decoupling and thermal break provided by the metal ring, the ceramic faceplate has a smaller and uniform temperature gradient relative to when the ceramic faceplate is of the same size (diameter) as the backing plate. Since the metal ring instead of the ceramic faceplate contacts the top plate and since the metal ring instead of the ceramic faceplate is subjected to the thermal load of the pedestal, no fractures (or defects) occur in the ceramic faceplate at temperatures greater than 590 degrees Celsius up to 650 degrees Celsius.

In one design, the metal ring is integrated into the backing plate. In another design, contact gaps between the smaller ceramic faceplate and the backing plate are designed to change a temperature profile at the edge of the ceramic faceplate such that no fractures due to thermal shock and localized stresses occur during processes requiring relatively high temperatures. The showerhead design also enhances axial cooling (i.e., cooling along a vertical axis perpendicular to the diameter) of the smaller ceramic faceplate due to contact conductance between the ceramic faceplate and the backing plate. Further, a cooling coil can be integrated into the backing plate to increase cooling capacity.

In the showerhead designs of the present disclosure, instead of the ceramic faceplate, the metal ring and the backing plate bordering the ceramic faceplate form the main vacuum seal for the processing chamber. These showerhead designs make the ceramic faceplate easily interchangeable (e.g., for uniformity improvement, micro-volume reduction, and material choice) and accessible (e.g., removable) by simply lifting the lid (top plate) of the processing chamber without requiring dismantling of the backing plate. Further, as explained below, pumping of micro-volume of exhaust gases through a manifold in the backing plate is facilitated by integrating a flow choke into the thermal break (i.e., where the metal ring contacts the ceramic faceplate). The flow choke provides uniformity control for the pumping of micro-volume of exhaust gases through the manifold in the backing plate.

Due to these features, the fracturing of the ceramic faceplate is eliminated, and thermal stresses are reduced to safe levels due to lower temperature gradient and linear expansion of the smaller ceramic faceplate. In addition, in some designs, other features of the showerhead, such as the metal ring surrounding the ceramic faceplate, are integrated into the backing plate through a diffusion bonding process. The material continuity and cooling capacity of the backing plate allows these gas passages to be cooled effectively. Accordingly, surfaces of these features can be plated with a corrosion resistant material (e.g., using electro-less Nickel plating) for corrosion resistance against process by-products. The metal ring can also be plated with a corrosion resistant material (e.g., using electro-less Nickel plating). These and other features of the showerheads of the present disclosure are now described below in detail.

The present disclosure is organized as follows. An example of a processing chamber in which a showerhead designed according to the present disclosure can be used is shown and described with reference to FIG. 1. The problem solved by the showerhead designs of the present disclosure is shown and described with reference to FIGS. 2A-2C. The solution to the problem is shown and described with reference to FIGS. 3A-3C. An example of a showerhead design according to the present disclosure is shown and described with reference to FIG. 4. An example of a pedestal and a showerhead designed according to the present disclosure is shown and described with reference to FIG. 5.

Thereafter, three different showerhead designs according to the present disclosure are shown and described with reference to FIGS. 6A-6C. Each showerhead design is shown and described in further detail with reference to FIGS. 7-9C. An example of a cooling plate used with the showerheads of the present disclosure is shown and described with reference to FIG. 10. The metal ring for the showerheads of the present disclosure is shown and described in further detail with reference to FIGS. 11A-11C. The backing plate for the showerheads of the present disclosure is shown and described in further detail with reference to FIG. 12. The ceramic faceplate of the showerheads of the present disclosure is shown and described in further detail with reference to FIGS. 13A-13C.

FIG. 1 shows an example of a substrate processing system 100 comprising a processing chamber 102 configured to process a substrate using thermal atomic layer deposition (T-ALD). The processing chamber 102 encloses other components of the substrate processing system 100. The processing chamber 102 comprises a substrate support (e.g., a pedestal) 104. During processing, a substrate 106 is arranged on the pedestal 104.

One or more heaters 108 (e.g., a heater array) may be disposed in a ceramic plate arranged on a metallic baseplate of the pedestal 104 to heat the substrate 106 during processing. One or more additional heaters called zone heaters or primary heaters (not shown) may be arranged in the ceramic plate above or below the heaters 108. Additionally, while not shown, a cooling system comprising cooling channels through which a coolant can be flowed to cool the pedestal 104 may be disposed in the baseplate of the pedestal 104; and one or more temperature sensors may be disposed in the pedestal 104 to sense the temperature of the pedestal 104.

The processing chamber 102 comprises a gas distribution device 110 such as a showerhead to introduce and distribute process gases into the processing chamber 102. The gas distribution device (hereinafter showerhead) 110 may include a stem portion 112 including one end connected to a top surface of the processing chamber 102. A base portion 114 of the showerhead 110 is generally cylindrical and extends radially outwardly from an opposite end of the stem portion 112 at a location that is spaced from the top surface of the processing chamber 102.

Figure 13A:
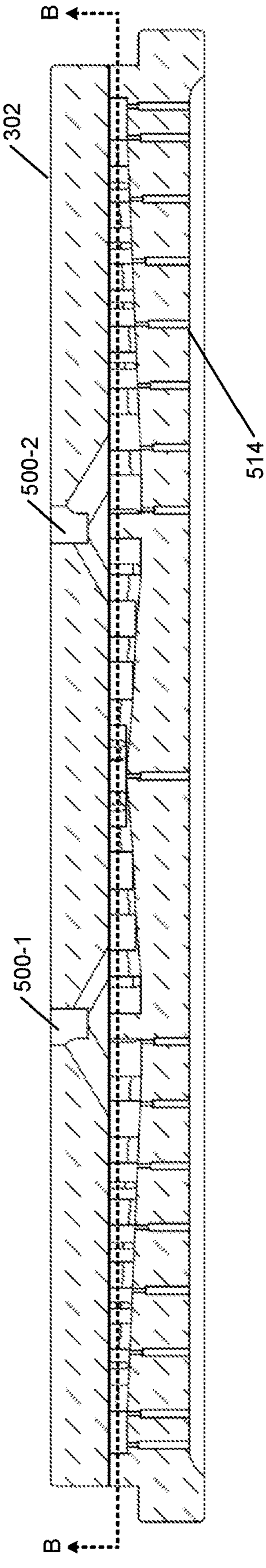
FIGS. 13A-13C show cross-sections of the ceramic faceplate of the showerheads of the present disclosure.
Figure 13B:
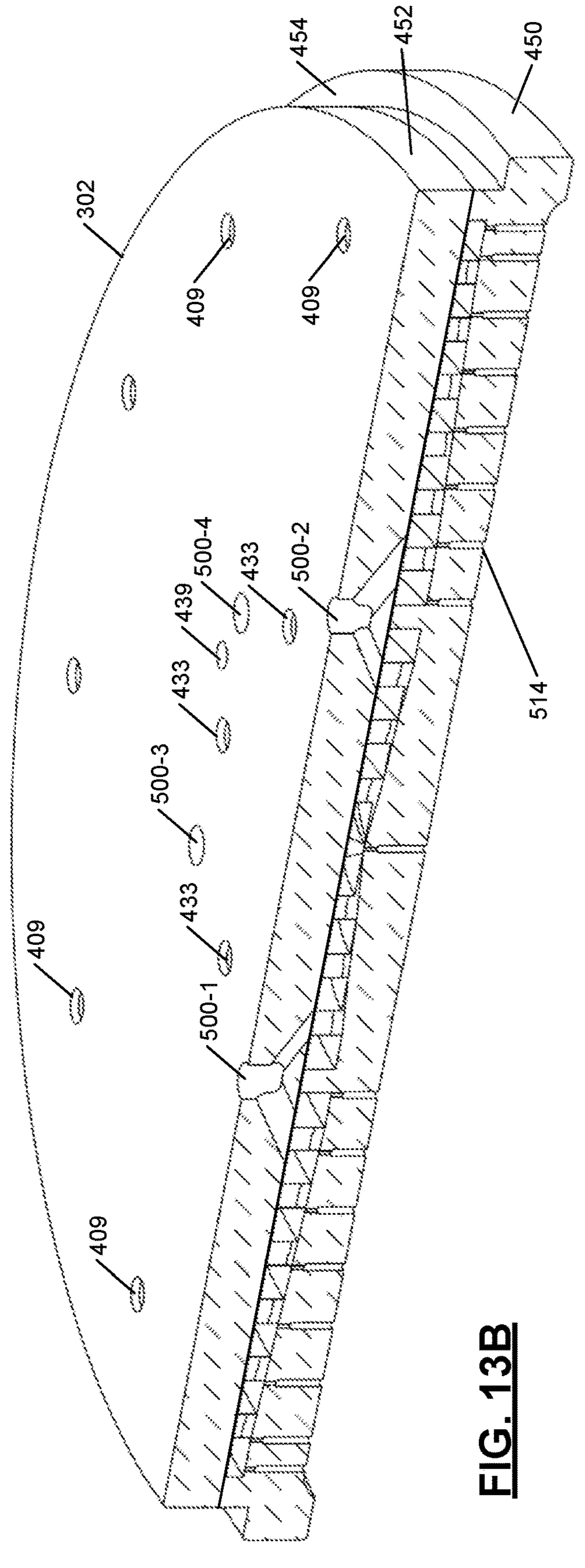
Figure 13C:
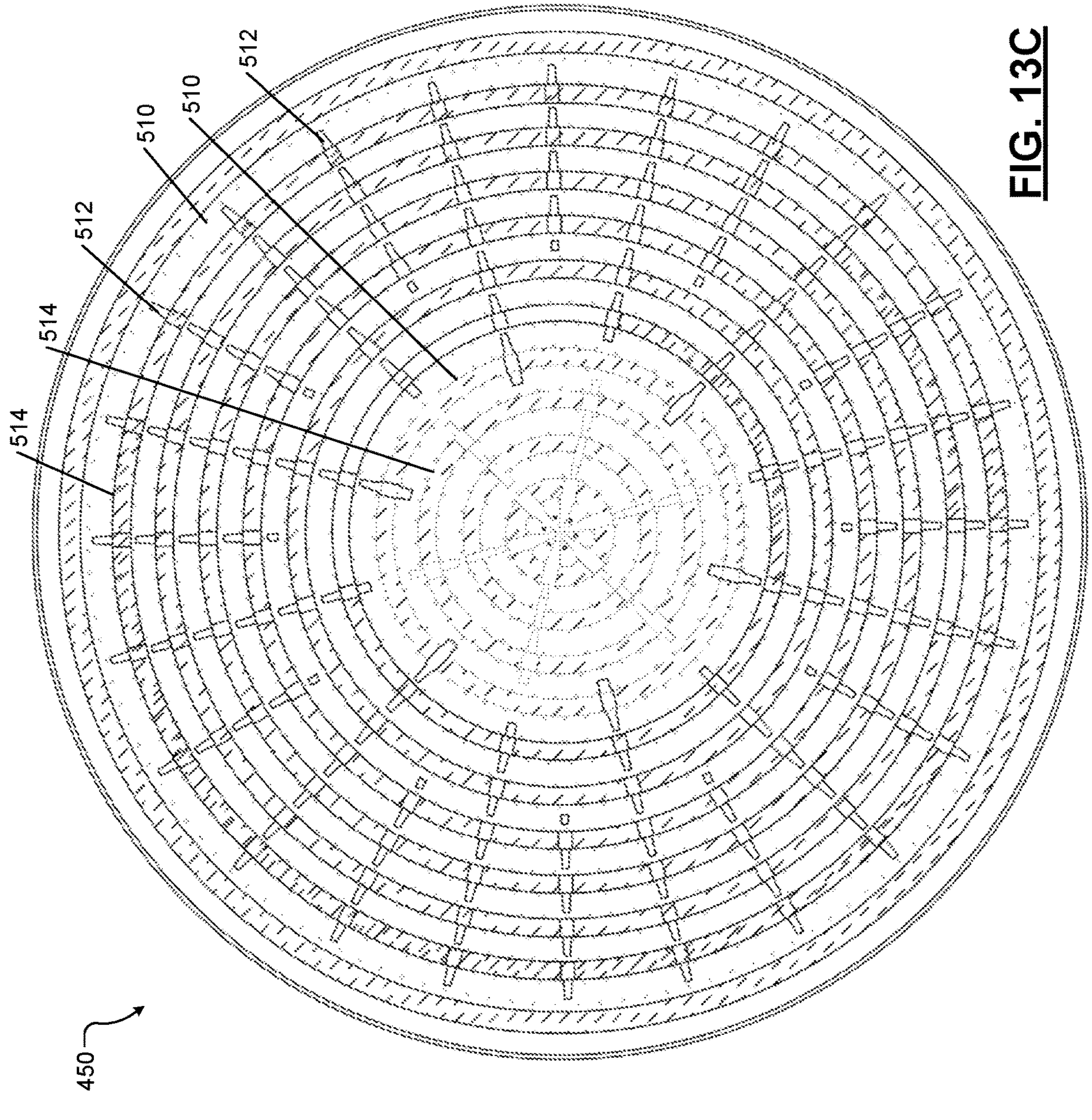

A substrate-facing surface of the base portion 114 of the showerhead 110 comprises a ceramic faceplate (shown in subsequent figures). The ceramic faceplate comprises a plurality of outlets or features (e.g., slots or through holes) through which precursors flow into the processing chamber 102. The ceramic faceplate of the showerhead 110, which is shown and described in detail with reference to FIGS. 13A-13C, is closer to the pedestal 104 than shown.

The ceramic faceplate is surrounded by a metal ring designed according to the present disclosure (shown and described with reference to subsequent figures). The showerhead 110 also comprises heating and cooling plates (shown and described with reference to subsequent figures). The heating plate includes one or more heaters. The cooling plate includes a cooling channel (see FIG. 10) through which a coolant can be circulated as described below. Additionally, while not shown, one or more temperature sensors may be disposed in the showerhead 110 to sense the temperature of the showerhead 110.

A gas delivery system 130 comprises one or more gas sources 132-1, 132-2, . . . , and 132-N (collectively gas sources 132), where N is an integer greater than zero. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 139. An output of the manifold 139 is fed to the processing chamber 102. The gas sources 132 may supply process gases, cleaning gases, purge gases, inert gases, and so on to the processing chamber 102.

A fluid delivery system 140 supplies a coolant to the cooling system in the pedestal 104 and to the cooling channel in the showerhead 110. A temperature controller 150 may be connected to the heaters 108, the zone heaters, and the temperature sensors in the pedestal 104, and to the heating plate and the temperature sensors in the showerhead 110. The temperature controller 150 may control power supplied to the heaters 108, the zone heaters, and coolant flow through the cooling system in the pedestal 104 to control the temperature of the pedestal 104 and the substrate 106. The temperature controller 150 may also control power supplied to the heaters disposed in the heating plate of the showerhead 110 and coolant flow through the cooling channel disposed in the cooling plate of the showerhead 110 to control the temperature of the showerhead 110.

A vacuum pump 158 maintains sub-atmospheric pressure inside the processing chamber 102 during substrate processing. A valve 155 is connected to an outlet in the showerhead 110 (shown in subsequent figures) from which exhaust gases exit the showerhead 110. A valve 156 is connected to an exhaust port of the processing chamber 102. The valves 156, 157 and the vacuum pump 158 are used to control pressure in the processing chamber 102 and to evacuate the exhaust gases from the showerhead 110 via the valve 155 and reactants from the processing chamber 102 via the valve 156. An isolation valve 157 may be arranged between the valves 155, 156 and the vacuum pump 158 as shown. A system controller 160 controls the components of the substrate processing system 100 including the valves 155, 156, 157 and the vacuum pump 158.

Figure 2A:
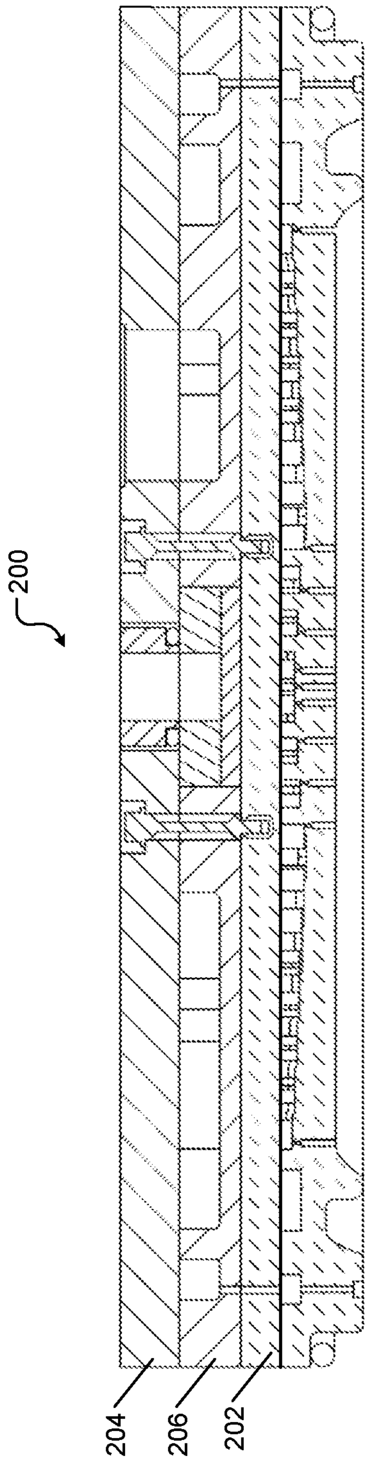
FIG. 2A shows a cross-section of a portion of a showerhead comprising a ceramic faceplate that is of the same size as a backing plate to which the ceramic faceplate is attached.
Figure 3A:
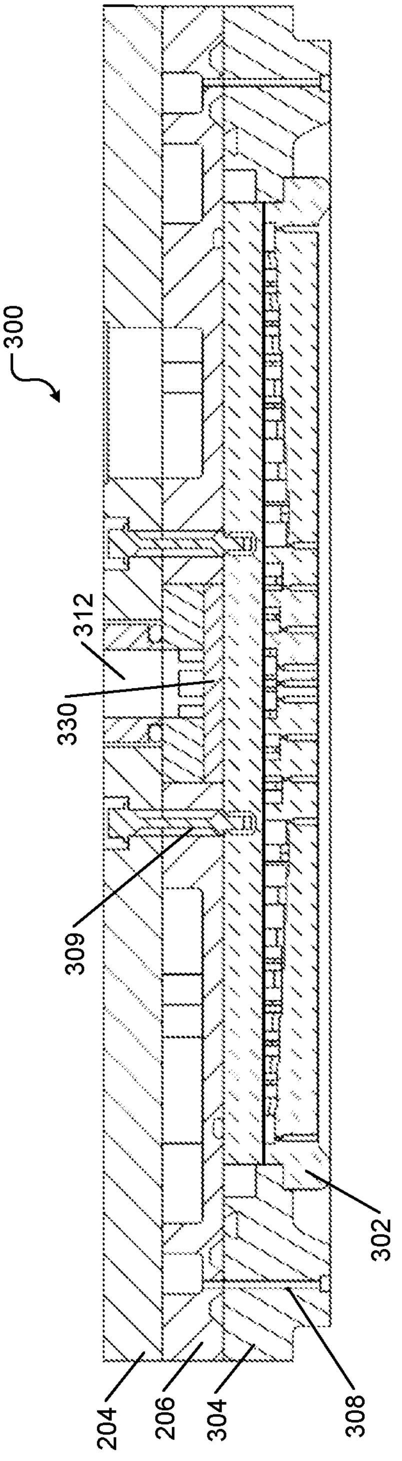
FIG. 3A shows a cross-section of a portion of a showerhead comprising a ceramic faceplate that is smaller than the backing plate and that is surrounded by a metal ring according to the present disclosure.
Figure 2B:
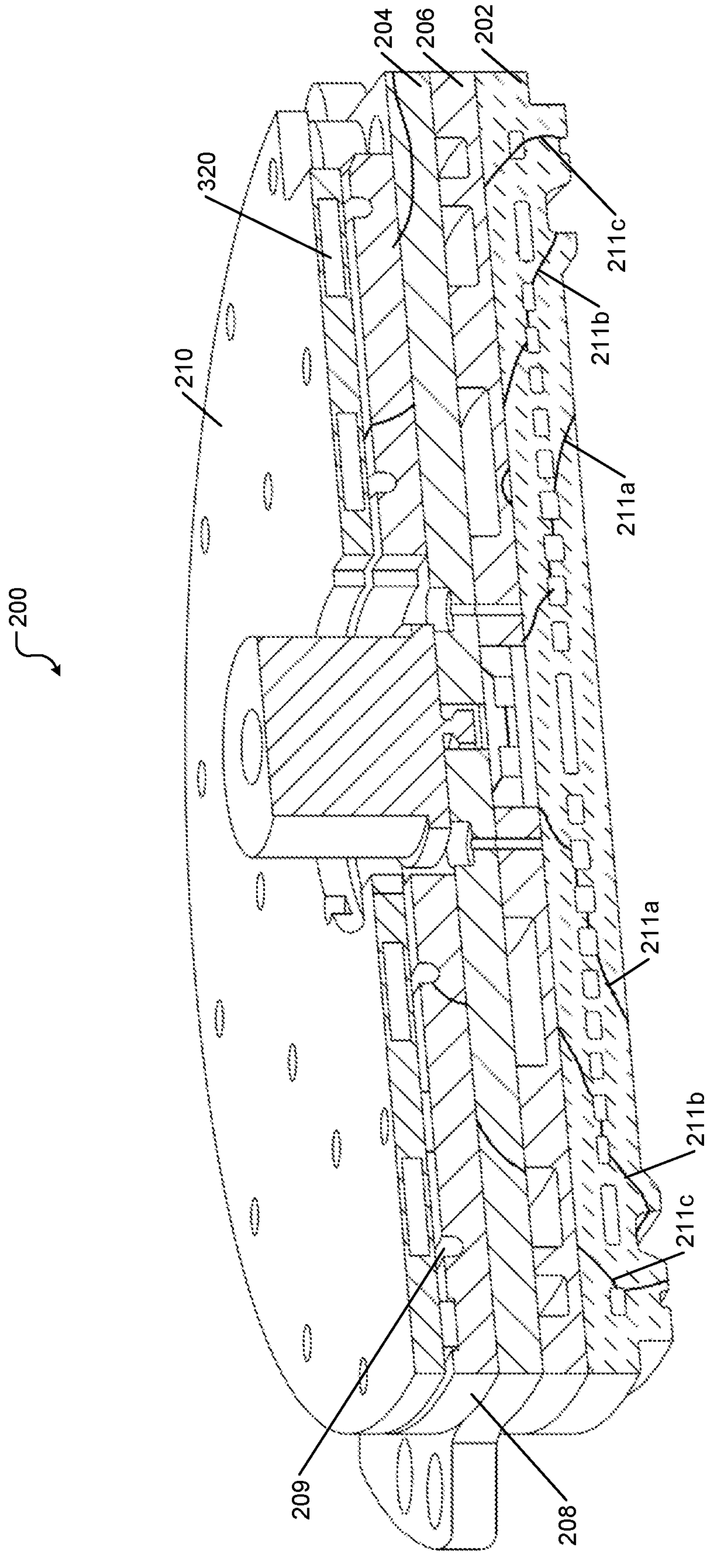
FIG. 2B shows temperature gradients in the showerhead of FIG. 2A.
Figure 3B:
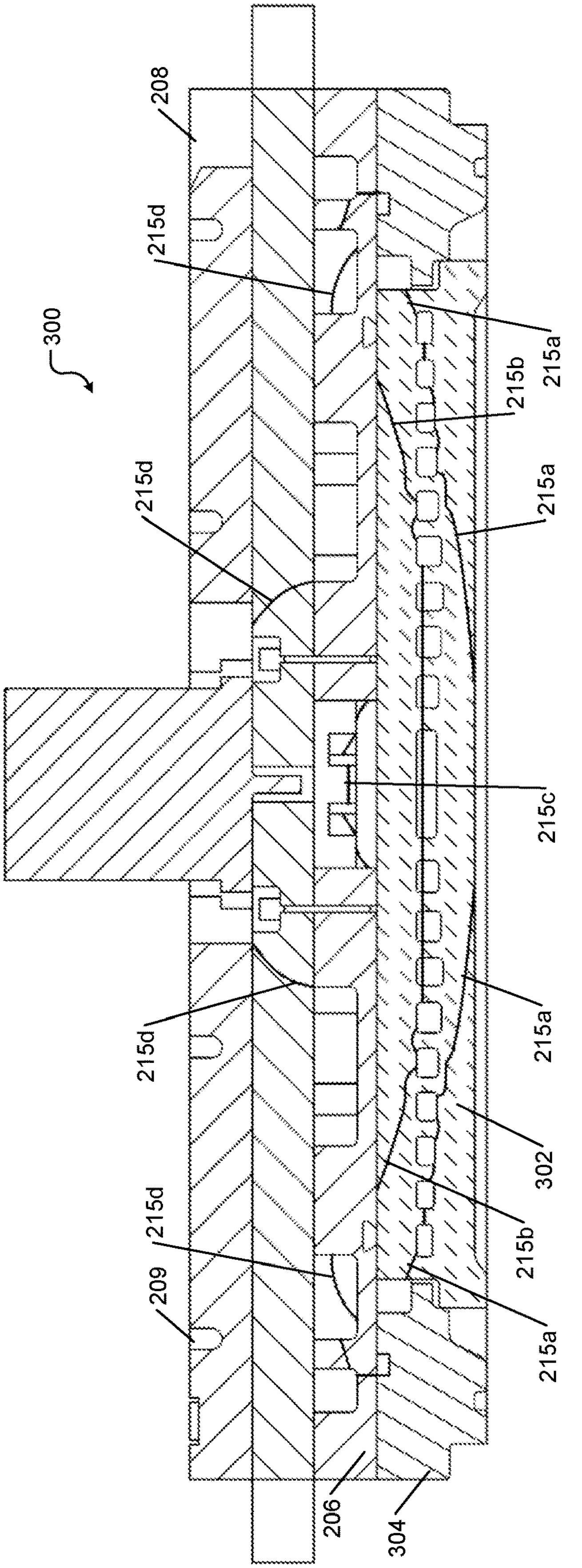
FIG. 3B shows temperature gradients in the showerhead of FIG. 3A.
Figure 3C:
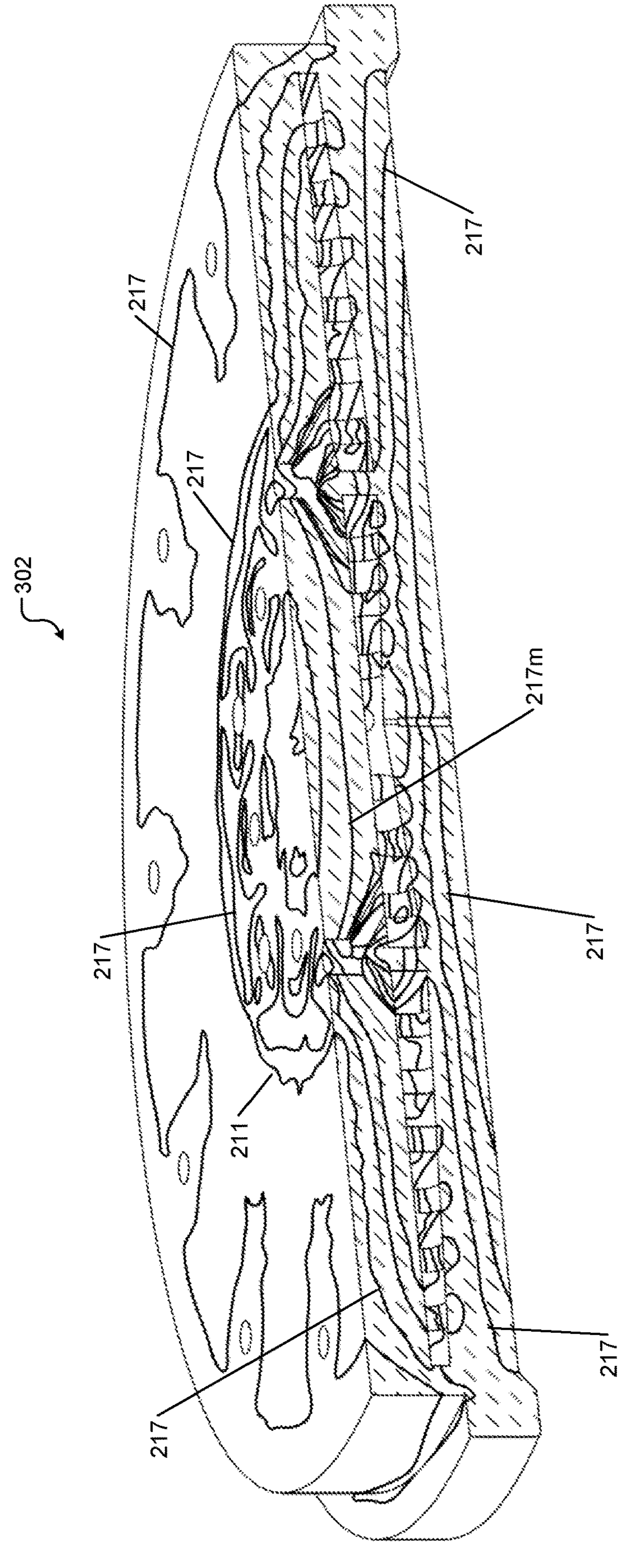
FIG. 3C shows stress concentration in the ceramic faceplate of the showerhead of FIG. 3A causing no defects in the ceramic faceplate.

FIGS. 2A-2C show an example of a showerhead in which the ceramic faceplate is of the same size as a backing plate to which the ceramic faceplate is attached. FIGS. 2B and 2C show temperature gradients and resulting stresses in the showerhead. FIG. 2D shows an origin of a fracture caused by the temperature gradient and resulting stresses in the ceramic faceplate of the showerhead. Subsequently, FIGS. 3A-3C show an example of a showerhead designed according to the present disclosure in which the ceramic faceplate is smaller than the backing plate and in which a metal ring is arranged around the ceramic faceplate. FIGS. 3B and 3C show temperature gradients and resulting stresses in this showerhead, which are different than in the showerhead shown in FIGS. 2A-2C due to the smaller ceramic faceplate and the arrangement of the metal ring around the ceramic faceplate as explained below in detail.

FIG. 2A shows a cross-section of a portion of a showerhead 200. The showerhead 200 comprises a ceramic faceplate 202 attached to a backing plate 204. The ceramic faceplate 202 is of the same size (diameter) as the backing plate 204. A manifold 206 is disposed between the ceramic faceplate 202 and backing plate 204. A micro-volume of exhaust gases from the processing chamber exits via the manifold 206 through an outlet in the backing plate 204 as explained below with reference to FIG. 4 onwards. The ceramic faceplate 202 includes gas passages and through holes, which are shown and described below with reference to FIGS. 13A-13C, to disperse gas into the processing chamber.

FIG. 2B shows the cross-section of the showerhead 200 with the addition of a heating plate 208 and a cooling plate 210. The heating plate 208 is arranged on the backing plate 204. The cooling plate 210 is arranged on the heating plate 208. The heating plate includes one or more heaters 209. The cooling plate 210 includes a cooling channel 320 (shown in detail in FIG. 10). Regions of the showerhead 200 with varying temperatures (i.e., temperature zones), causing a temperature gradient across the showerhead 200, are shown by wavy lines 211.

For example, when the set point for the temperature of the pedestal during a process is about 590 degrees Celsius, and temperature of the cooling plate 210 is about 20-25 degrees Celsius, the temperature from the center of the ceramic faceplate 202 to lines 211*a* is about 290-295 degrees Celsius; the temperature from lines 211*a* to lines 211*b* is about 250 degrees Celsius; the temperature from lines 211*b* to lines 211*c* is about 225 degrees Celsius; and so on. The temperature at the periphery or the OD of the ceramic faceplate 202 of the showerhead 200 is about 200 degrees Celsius. Thus, the temperature varies radially and axially (i.e., along a vertical axis of the showerhead 200) across the showerhead 200 between about 290-295 degrees Celsius at the center of the ceramic faceplate 202 to about 200 degrees Celsius at the periphery or the OD of the ceramic faceplate 202, causing a relatively high temperature gradient across the showerhead 200.

FIG. 2C shows the ceramic faceplate 202 of the showerhead 200. Regions of the ceramic faceplate 202 with varying stress (expressed in kilopound per square inch or ksi) caused by the temperature gradient across the ceramic faceplate 202 are shown by the wavy lines 213. For example, when the set point for the temperature of the pedestal during a process is about 590 degrees Celsius and the temperature of the cooling plate 210 is about 20-25 degrees Celsius, the stress from the center of the ceramic faceplate 202 to lines 213*a* is about 1.6 ksi; the stress from lines 213*a* to lines 213*b* is about 2.9 ksi; the stress from lines 213*b* to lines 213*c* is about 6.7 ksi; the stress from lines 213*b* to lines 213*c* is about 7.9 ksi; and the stress at the periphery or the OD of the ceramic faceplate 202 of the showerhead 200 is about 9.2 ksi. Thus, the stress increases radially across the ceramic faceplate 202.

At the OD of the ceramic faceplate 202, the bottom portion of the ceramic faceplate 202 is at a close spatial distance from a pedestal of a processing chamber. Accordingly, the edge of the ceramic faceplate 202 is subjected to the thermal load from the pedestal during substrate processing. As a result, the temperature at the OD of the ceramic faceplate 202 is relatively high at 212.

Further, since the ceramic faceplate 202 is of the same size (diameter) as the backing plate 204, the OD of the ceramic faceplate 202 directly contacts a top plate (or side wall) of the processing chamber that surrounds the showerhead 200. The top plate is relatively cold and has a very different CTE than the ceramic faceplate 202. Therefore, due to the thermal load from the pedestal and direct contact with the cold top plate having a different CTE than the ceramic faceplate 202, a radial temperature gradient across the ceramic faceplate 202 is relatively high.

FIG. 2D shows the stress caused by the radial temperature gradient in the peripheral region (i.e., near the OD) of the ceramic faceplate 202. Following the above example of the pedestal set point temperature, the stress gradually increases from 213*a* to 213*g* and is maximum (e.g., more than 10 ksi) at 212. Thus, the relatively high radial temperature gradient across the ceramic faceplate 202 and the relatively high stress at the OD of the ceramic faceplate 202 cause a fracture at the OD of the ceramic faceplate 202 as shown at 212. The problem is exacerbated by relatively high set point temperatures of the pedestal required for some processes (e.g., greater than 650 degrees Celsius).

FIG. 3A shows a cross-section of a portion of a showerhead 300 according to the present disclosure. The showerhead 300 comprises a ceramic faceplate 302 that is smaller in diameter than the ceramic faceplate 202 of the showerhead 200. Specifically, the ceramic faceplate 302 is smaller in diameter than the backing plate 204. A metal ring 304 (e.g., made of Aluminum) is arranged around the ceramic faceplate 302 as shown. The ceramic faceplate 302 and the metal ring 304 are attached to the manifold 206. Accordingly, instead of the ceramic faceplate 302, the metal ring 304 directly contacts the top plate (or sidewall) of the processing chamber.

The metal ring 304 decouples (physically and thermally) the ceramic faceplate 302 from the top plate (or sidewall) of the processing chamber that surrounds the showerhead 300. Further, instead of the OD of the ceramic faceplate 302, the metal ring 304 is at a close spatial distance from the pedestal of the processing chamber (see FIG. 5). As a result, instead of the OD of the ceramic faceplate 302, the metal ring 304 is subjected to the heat load from the pedestal during substrate processing. The ceramic faceplate 302 includes gas passages and through holes, which are shown and described below with reference to FIGS. 13A-13C, to disperse gas into the processing chamber.

Figure 11A:
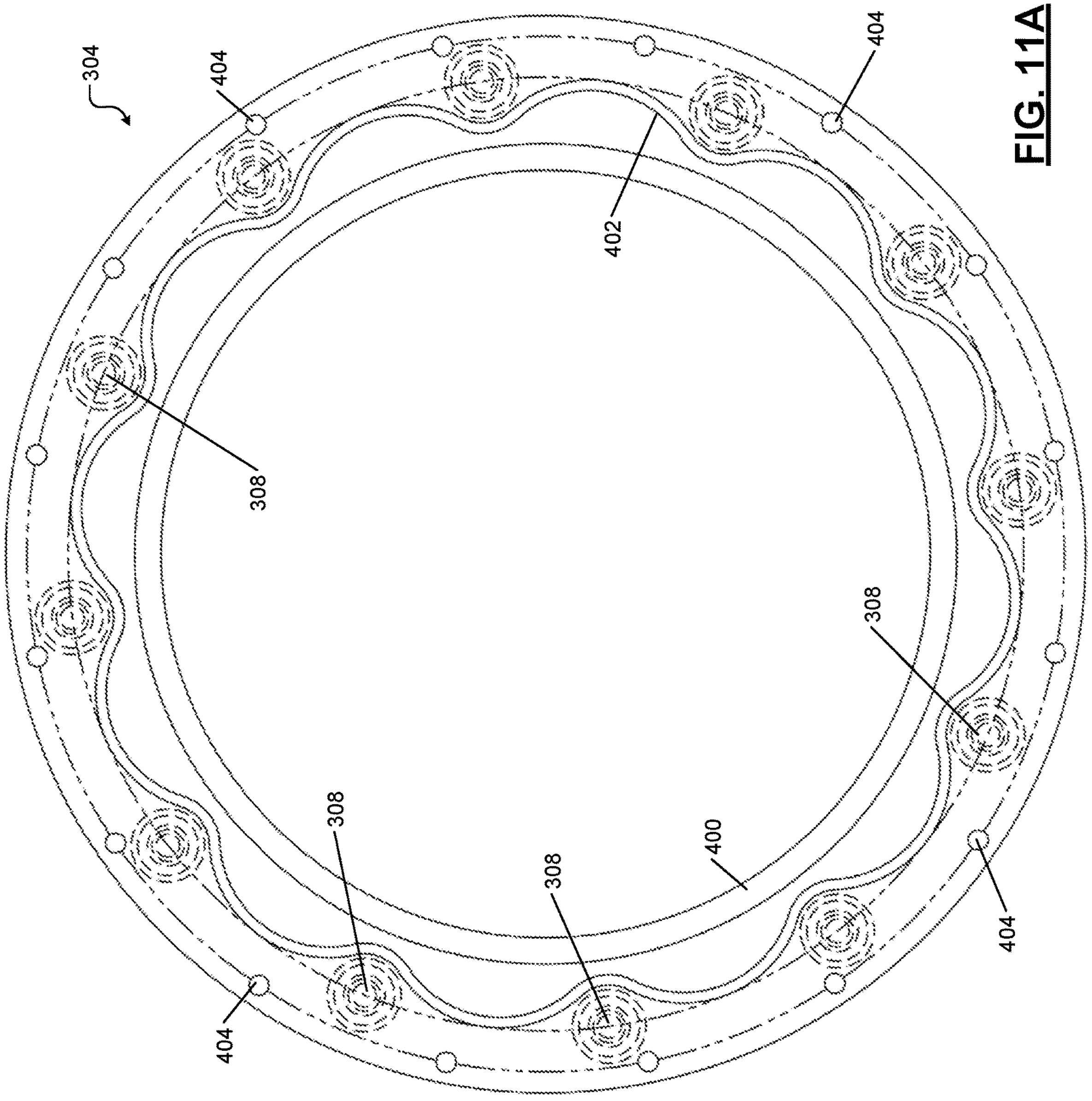
FIGS. 11A-11C show an example of the metal ring used with the showerheads of the present disclosure in further detail.

In the showerhead 300, in addition to facilitating pumping of the exhaust gases through an outlet in the backing plate 204 (shown in FIG. 5), an outer portion of the manifold 206 is used to inject an inert gas (e.g., Argon) through a plurality of holes 308 in the metal ring 304 into the processing chamber (e.g., the processing chamber 102 shown in FIG. 1). The holes 308 are shown in detail in FIGS. 11A-12. By injecting the inert gas through the holes 308 into the processing chamber, a curtain of the inert gas is formed around a reaction zone (i.e., deposition region or the region surrounding the substrate) in the processing chamber to isolate the substrate (e.g., the substrate 106 shown in FIG. 1) from backflow of contaminants/byproducts in the chamber volume. The holes 308 in the metal ring 304 align with corresponding holes in the outer portion of the manifold 206 as shown in FIGS. 11A-12. An inlet for supplying the inert gas to the holes 308 is arranged through the backing plate 204 as shown and described below with reference to FIG. 9C.

Fasteners 309 are used to fasten the manifold 206 to the ceramic faceplate 302. The manifold 206 includes holes (shown in FIG. 12) for the fasteners 309. Similar fasteners (shown in FIG. 4) are used to fasten the manifold 206 to the metal ring 304. The metal ring 304 includes holes (shown in FIGS. 11A-11C) for the fasteners. An adapter 330 splits gas flow from a gas inlet in the stem portion 312 to feed the gas received from the gas inlet in the stem portion 312 to a plurality of gas inlets of the ceramic faceplate 302 as described below in further detail with reference to FIG. 12.

Other structures shown are described later with reference to FIG. 4 onwards. First, the temperature gradient across the showerhead 300 and the stress caused by the temperature gradient across the ceramic faceplate 302 are explained below.

FIG. 3B shows the cross-section of the showerhead 300 with the addition of the heating plate 208. The cooling plate 210 is present above the heating plate 208 and is shown in FIG. 4. Regions of the showerhead 300 with varying temperatures (i.e., temperature zones), causing a temperature gradient across the showerhead 300, are shown by the wavy lines 215.

For example, when the set point for the temperature of the pedestal during a process is about 590 degrees Celsius, and temperature of the cooling plate 210 is about 20-25 degrees Celsius, the temperature in the region of the ceramic faceplate 302 below lines 215*a* is about 270-290 degrees Celsius; the temperature in the region of the ceramic faceplate 302 from lines 215*a* to lines 215*b* is about 250-270 degrees Celsius; the temperature in the region of the ceramic faceplate 302 from lines 215*b* to lines 215*c* is about 250-225 degrees Celsius; the temperature in the region of the ceramic faceplate 302 from lines 215*c* to lines 215*d*, including the temperature of the metal ring 304, is about 225-200 degrees Celsius; and the temperature in the region of the ceramic faceplate 302 beyond lines 215*d* is about 200-185 degrees Celsius. Thus, the temperature gradient across the showerhead 300, particularly across the ceramic faceplate 302 of the showerhead 300, is lower and more uniform relative to the temperature gradient across the showerhead 200 and across the ceramic faceplate 202 of the showerhead 200.

FIG. 3C shows the stress concentration in the ceramic faceplate 302 of the showerhead 300. Regions of the ceramic faceplate 302 with varying stress caused by the temperature gradient across the ceramic faceplate 302 are shown by the wavy lines 217. For example, when the set point for the temperature of the pedestal during a process is about 590 degrees Celsius and the temperature of the cooling plate 210 is about 20-25 degrees Celsius, the maximum stress across the ceramic faceplate 202 shown by the line 217*m* is about 6.4 ksi, which is about 40% less than the maximum stress across the ceramic faceplate 202 of the showerhead 200.

As described above, the metal ring 304 decouples the ceramic faceplate 302 from the top plate. Further, instead of the OD of the ceramic faceplate 302, the metal ring 304 is subjected to the heat load from the pedestal. Therefore, the ceramic faceplate 302 has a relatively smaller and uniform temperature gradient than the ceramic faceplate 202 of the showerhead 200. As a result, the OD of the ceramic faceplate 302 does not fracture or deform (or have a defect) at relatively high set point temperatures of the pedestal (e.g., greater than 590 degrees Celsius up to 650 degrees Celsius).

Figure 4:
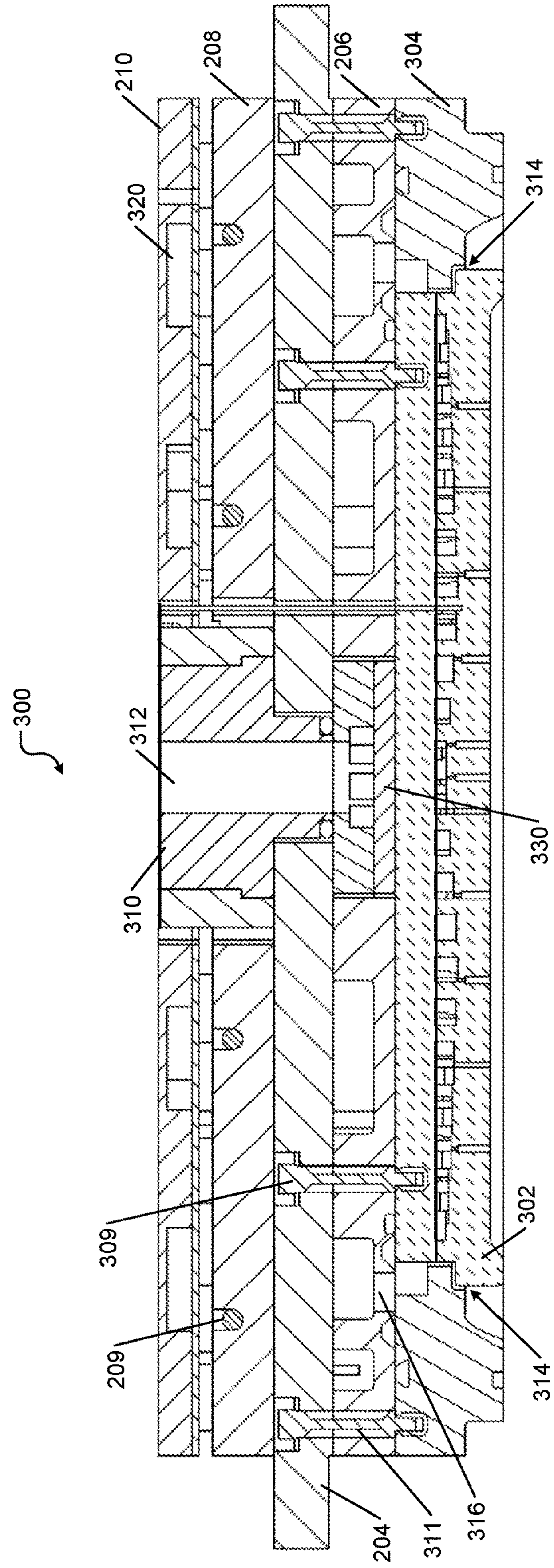
FIG. 4 shows a cross-section of an example of a showerhead designed according to the present disclosure.

FIG. 4 shows a cross-section of the entire showerhead 300. The showerhead 300 comprises a valve 310 connected to a stem portion 312 that can be attached to a top plate of a processing chamber (e.g., the processing chamber 102 shown in FIG. 1). The showerhead 300 includes the gas inlet in the stem portion 312 for supplying one or more gases (e.g., supplied by the gas delivery system 130 shown in FIG. 1) into the processing chamber via through holes (shown in FIG. 13C) in the ceramic faceplate 302. The metal ring 304 provides a thermal break to the ceramic faceplate 302 at the OD of the ceramic faceplate 302 as shown at 314. Fasteners 309 and 311 are respectively used to fasten the manifold 206 to the ceramic faceplate 302 and the metal ring 304.

The showerhead 300 includes exhaust holes 316 in the manifold 206 (also see FIG. 12). A micro-volume of exhaust gases from the processing chamber exits the showerhead 300 through the exhaust holes 316 via an outlet in the backing plate 204 (shown in FIG. 5). In addition to providing the thermal break, the interface between the ID of the metal ring 304 and the OD of the ceramic faceplate 302 (i.e., between an inner edge of the metal ring 304 and an outer edge of the ceramic faceplate 302) provides a flow choke (also shown at 314). The flow choke provides uniformity control for the pumping of the micro-volume of the exhaust gases through the manifold 206.

Figure 5:
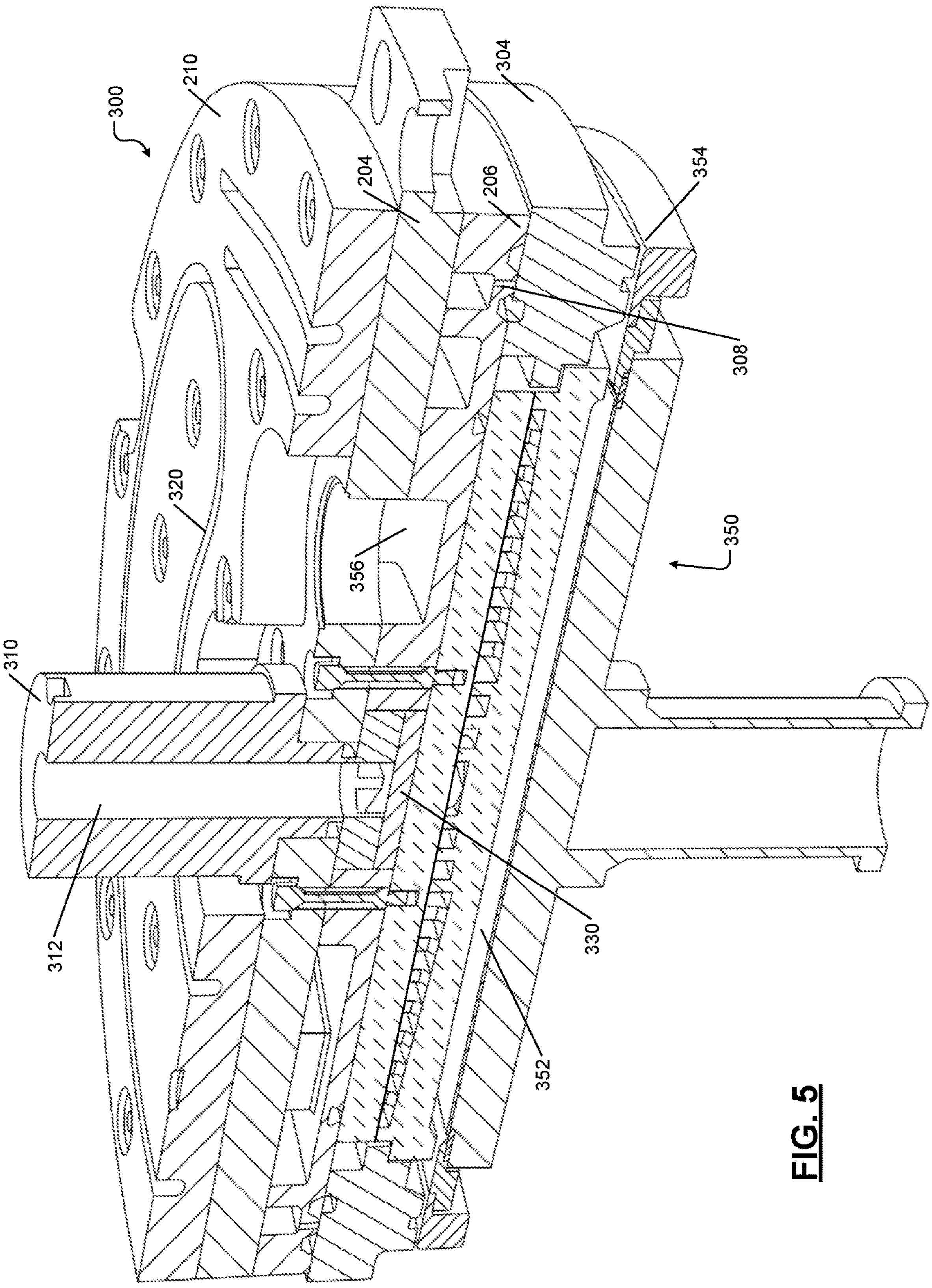
FIG. 5 shows a cross-section of an example of a pedestal along with the showerhead of FIG. 4 according to the present disclosure.

FIG. 5 shows a cross-section of the showerhead 300 and a pedestal 350. A substrate is placed on the pedestal 350 at 352. The metal ring 304 contacts the periphery or outer edge of the pedestal 350 as shown at 354. The ceramic faceplate 302 does not contact the pedestal 350. The micro-volume of the exhaust gases exits the showerhead 300 via an outlet 356 connected to the manifold 206 through the backing plate 204.

Figure 6A:
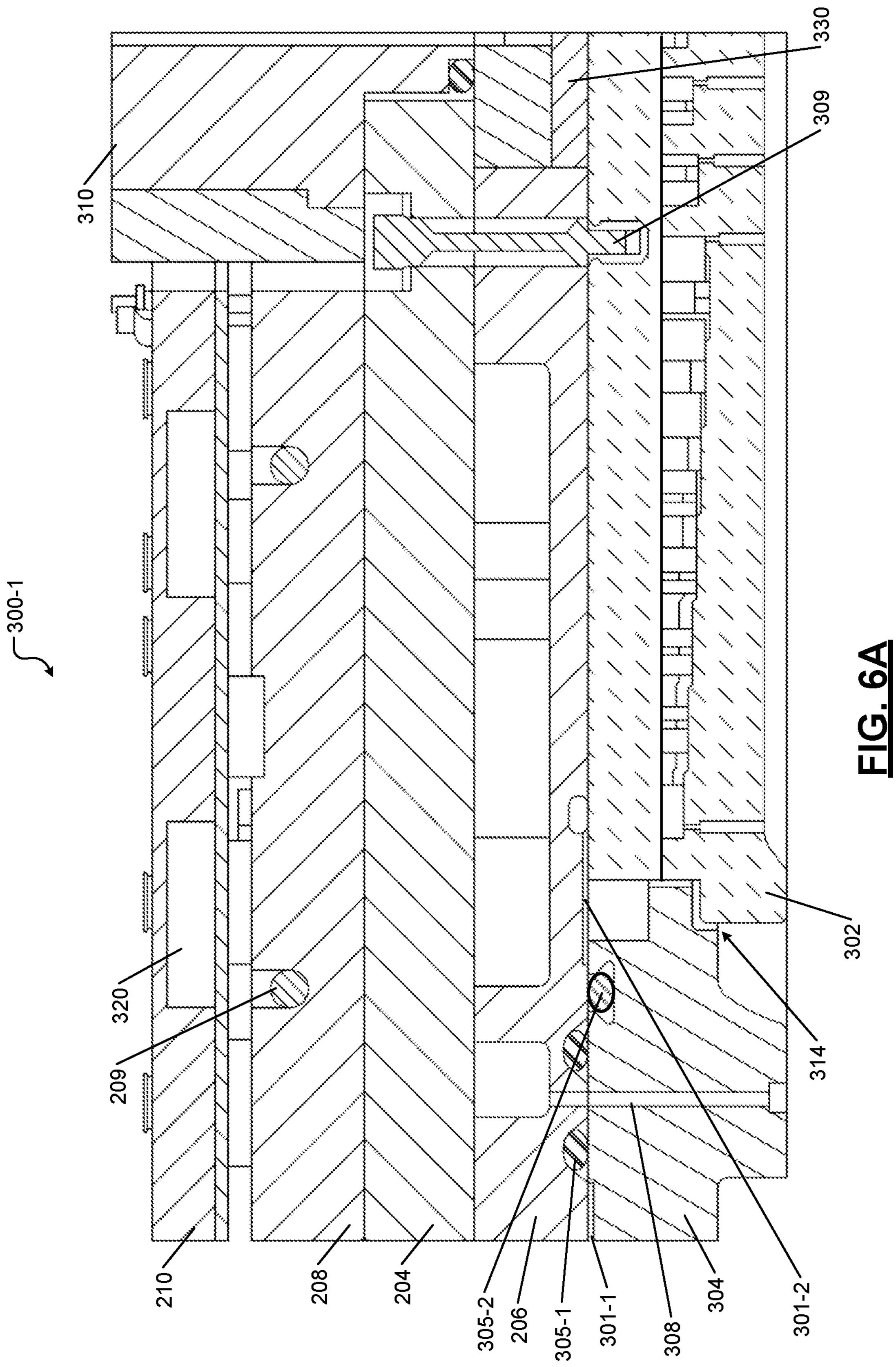
FIG. 6A shows a cross-section of a portion of a first showerhead according to the present disclosure.
Figure 6B:
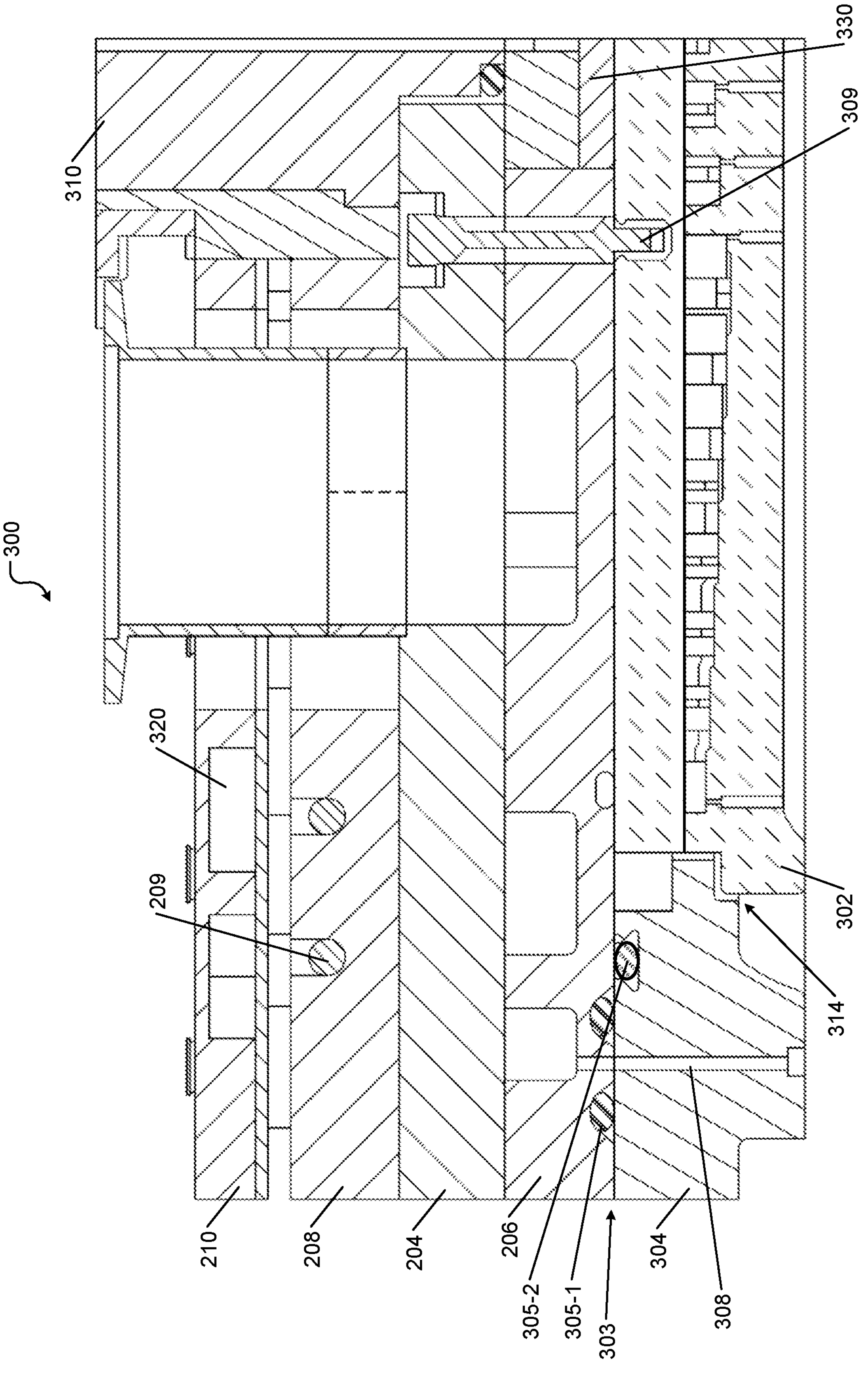
FIG. 6B shows a cross-section of a portion of a second showerhead (same as in FIGS. 3A-5) according to the present disclosure.
Figure 6C:
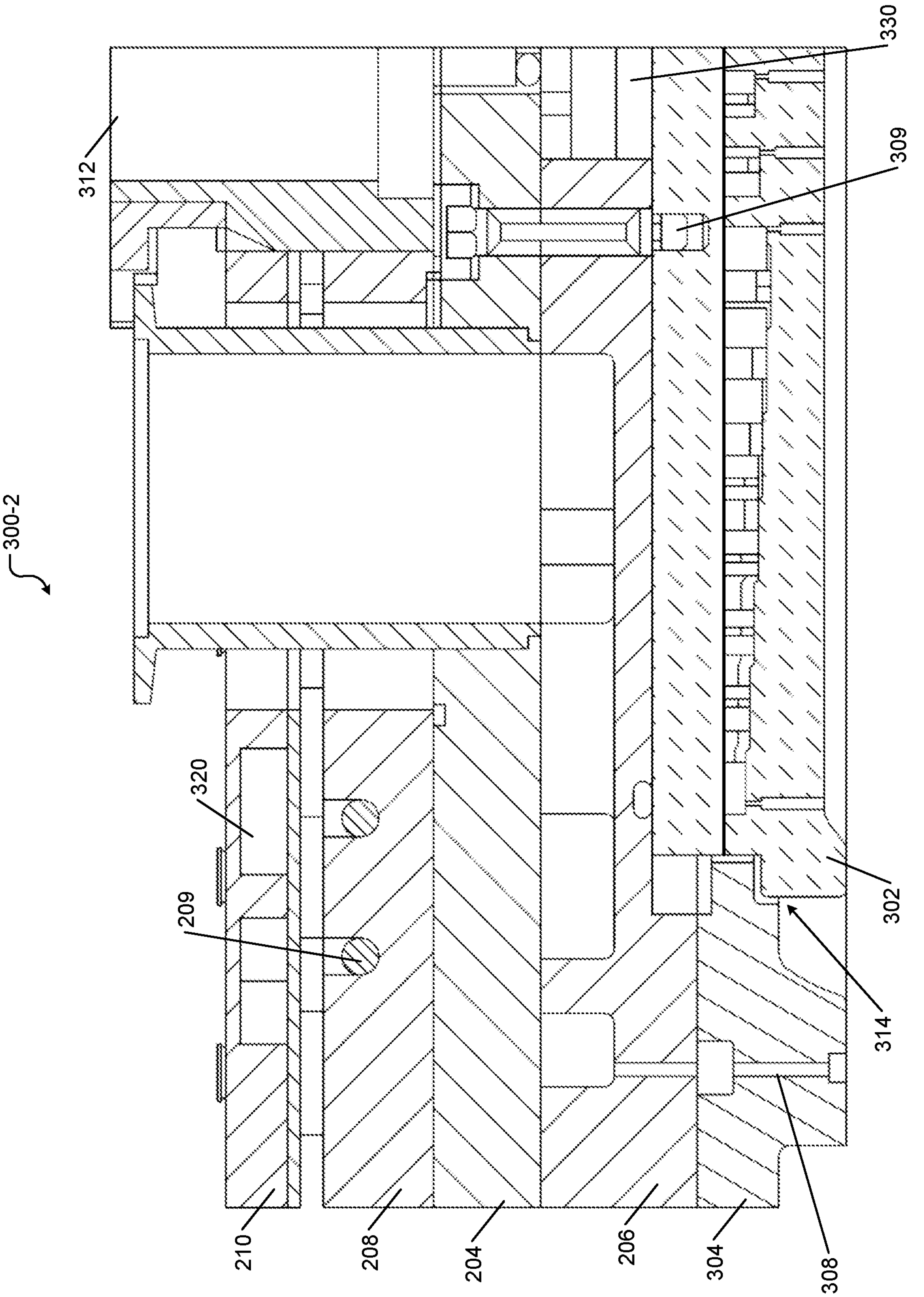
FIG. 6C shows a cross-section of a portion of a third showerhead according to the present disclosure.

FIGS. 6A-6C show partial cross-sections of different showerheads of the present disclosure. FIG. 6A shows a partial cross-section of a showerhead 300-1 according to the present disclosure. The showerhead 300-1 is similar to the showerhead 300 except that gaps 301-1 and 301-2 (collectively, gaps 301) are provided respectively between the bottom of the manifold 206 and the top of the metal ring 304 and between the bottom of the manifold 206 and a top portion of the ceramic faceplate 302 near the OD of the ceramic faceplate 302. For example, the gaps 301 can be about 0.020 inch.

Specifically, the gaps 301 are created by providing recesses in both the metal ring 304 and the manifold 206 as follows. The top surface of the metal ring 304 is recessed at the OD (and while not shown, optionally also at the ID) of the metal ring 304 as shown at 301-1. Most of the bottom surface of the manifold 206 above the top surface of the metal ring 304 (i.e., at the OD of the backing plate 204) is not recessed. The bottom surface of the manifold 206 is recessed from above the ID of the metal ring 304 to above the OD of the ceramic faceplate 302 as shown at 301-2.

The gaps 301 restrict the heat flow from the edge (OD) of the ceramic faceplate 302. A thermal contact between the ceramic faceplate 302 and the manifold 206 at the center regions of the ceramic faceplate 302 and the manifold 206 (shown in FIG. 7) elevates the heat flow from the center region of the ceramic faceplate 302, causing a relatively cold region at the center region of the ceramic faceplate 302.

O-rings 305-1, 305-2 (collectively O-rings 305) are located between the un-recessed portion of the top surface of the metal ring 304 and the un-recessed portion of the bottom surface of the manifold 206. The O-rings 305 are also present in the showerhead 300 as shown in FIG. 6B but are not present in a showerhead 300-2 as shown in FIG. 6C as explained below.

FIG. 6B show a partial cross-section of the showerhead 300. Unlike in the showerhead 300-1 shown in FIG. 6A, in the showerhead 300, there are no gaps between the bottom surface of the manifold 206 and the top surface of the metal ring 304 and between the bottom surface of the manifold 206 and the top surface of the ceramic faceplate 302.

Instead, the top surface of the metal ring 304 and the top surface of the ceramic faceplate 302 are flush (i.e., in direct contact) with the bottom surface of the manifold 206 as shown at 303. The O-rings 305 are located between the un-recessed portion of the top surface of the metal ring 304 and the un-recessed portion of the bottom surface of the manifold 206.

FIG. 6C shows a partial cross-section of the showerhead 300-2. The showerhead 300-2 is similar to the showerhead 300 except that not only the top surface of the metal ring 304 and the top surface of the ceramic faceplate 302 are flush (i.e., in direct contact) with the bottom surface of the manifold 206 but the metal ring 304 is integrated with the manifold 206 using a diffusion bonding process, and the ceramic faceplate 302 is fastened (e.g., bolted) to the manifold 206 (see FIGS. 12-13C showing through holes for fasteners).

Since the metal ring 304 is integrated with the manifold 206, unlike in the showerheads 300 and 300-1, the O-rings 305 are unnecessary and therefore not present in the showerhead 300-2. The diffusion bonding allows for Ni-plating of surfaces at relatively lower temperatures (e.g., surfaces of gas passages in the ceramic faceplate 302 shown in FIGS. 13A-13C and surfaces of the metal ring 304).

Figure 7:
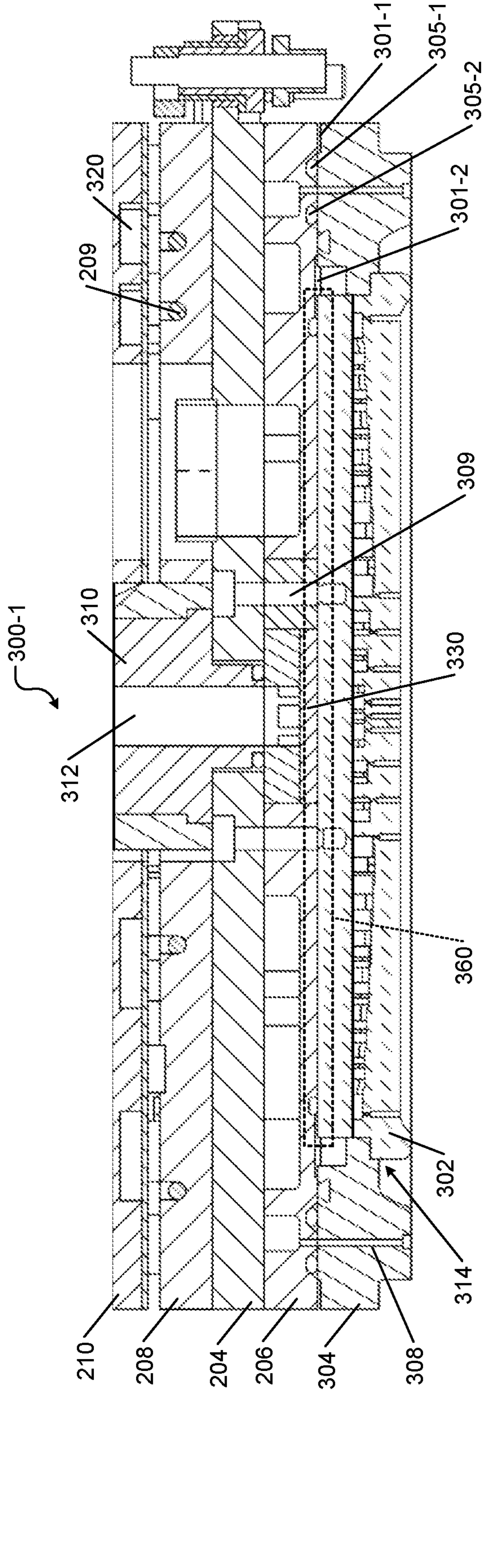
FIG. 7 shows a cross-section of the first showerhead in further detail.

FIG. 7 shows a cross-section of the showerhead 300-1 across the entire diameter of the showerhead 300-1. The gaps 301 between the metal ring 304 and the manifold 206 and between the ceramic faceplate 302 and the manifold 206 can be seen as being annular. The thermal contact between the center regions of the ceramic faceplate 302 and the manifold 206 is shown at 360.

Figure 8A:
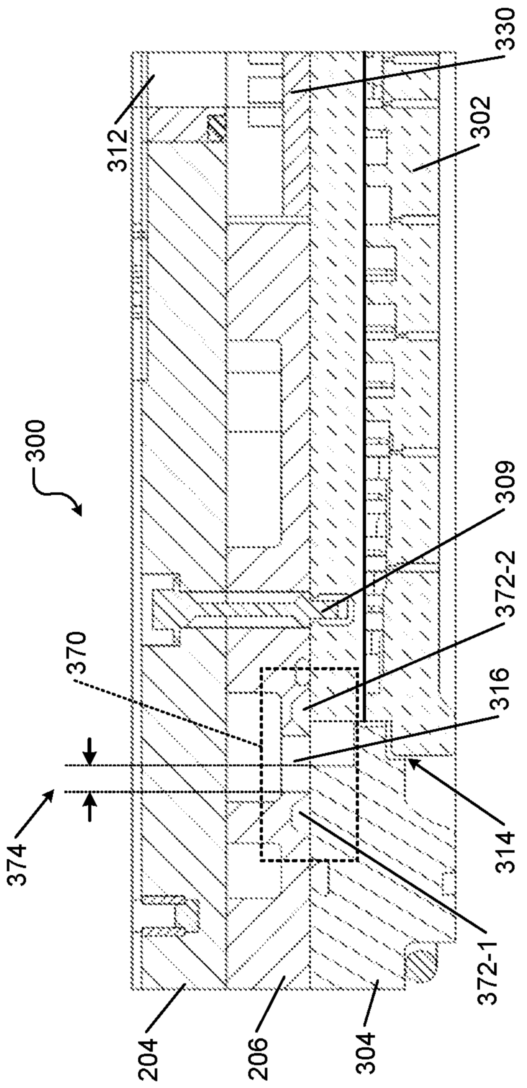
FIGS. 8A and 8B respectively show cross-sections of portions of the second and third showerheads in further detail.
Figure 8B:
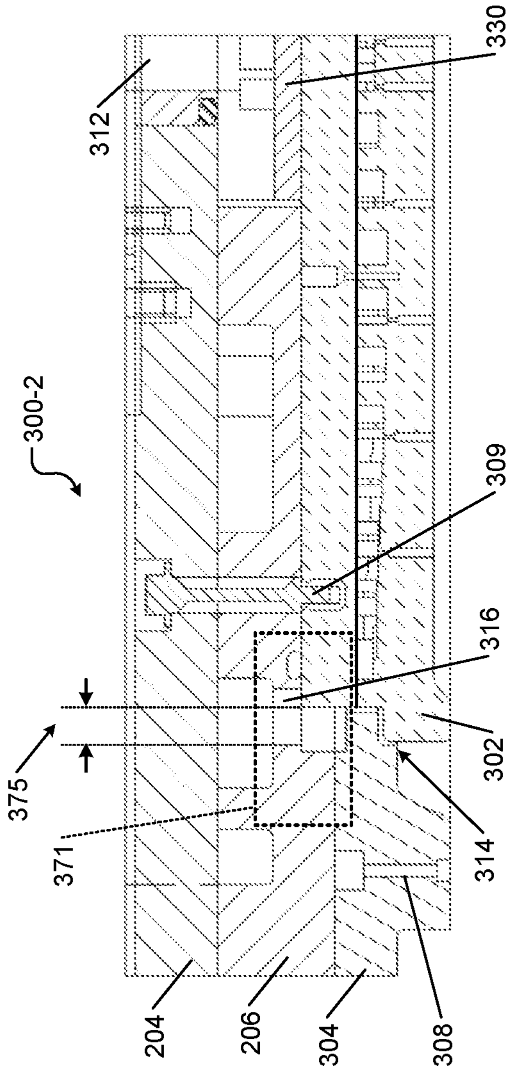

FIGS. 8A and 8B respectively show additional details about the presence and the absence of a dead volume due to grooves of O-rings and resulting occlusion of the exhaust holes in the showerheads 300 and 300-2. FIG. 8A shows at 370 a dead volume due to the O-ring grooves 372-1 and 372-2 (collectively grooves 372) and resulting occlusion 374 of the exhaust holes 316 in the showerhead 300.

FIG. 8B shows that due to the integration of the metal ring 304 with the manifold 206 and consequent absence of the O-rings 305 and grooves 372, the dead volume shown at 370 in FIG. 8A is absent at 371, and the exhaust holes 316 in FIG. 8B are less occluded (i.e., more open) as shown at 375 than the exhaust holes 316 in FIG. 8A as shown at 374. Specifically, in the showerhead 300-2, integrating the metal ring 304 with the manifold 206 eliminates the need for the O-rings 305 shown in FIGS. 6A and 6B and grooves 372 shown in FIG. 8A, which removes the dead volume present in the showerhead 300, and which also reduces the occlusion of the exhaust holes 316 in the showerhead 300-2 as compared to the occlusion in the showerhead 300.

Figure 9A:
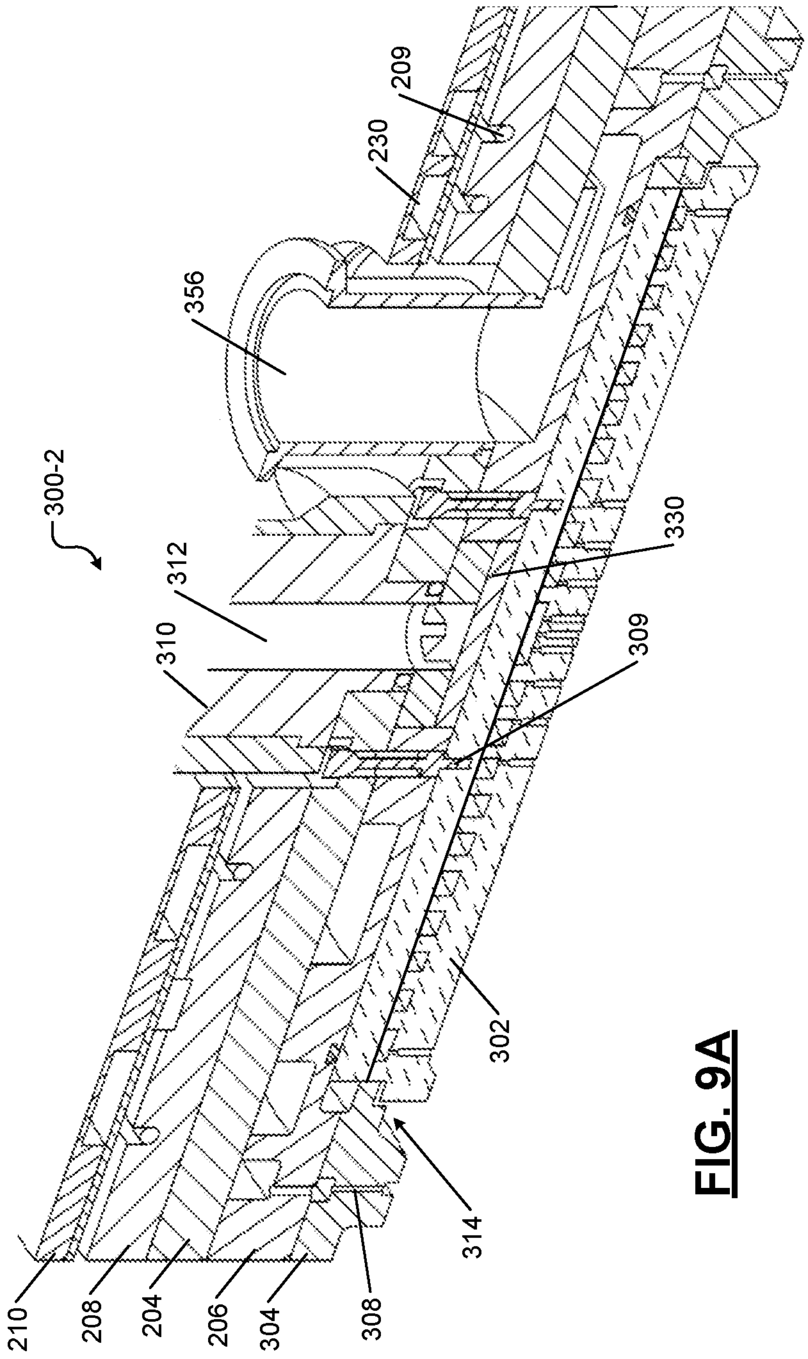
FIGS. 9A and 9B show different cross-section views of the third showerhead in further detail.
Figure 9B:
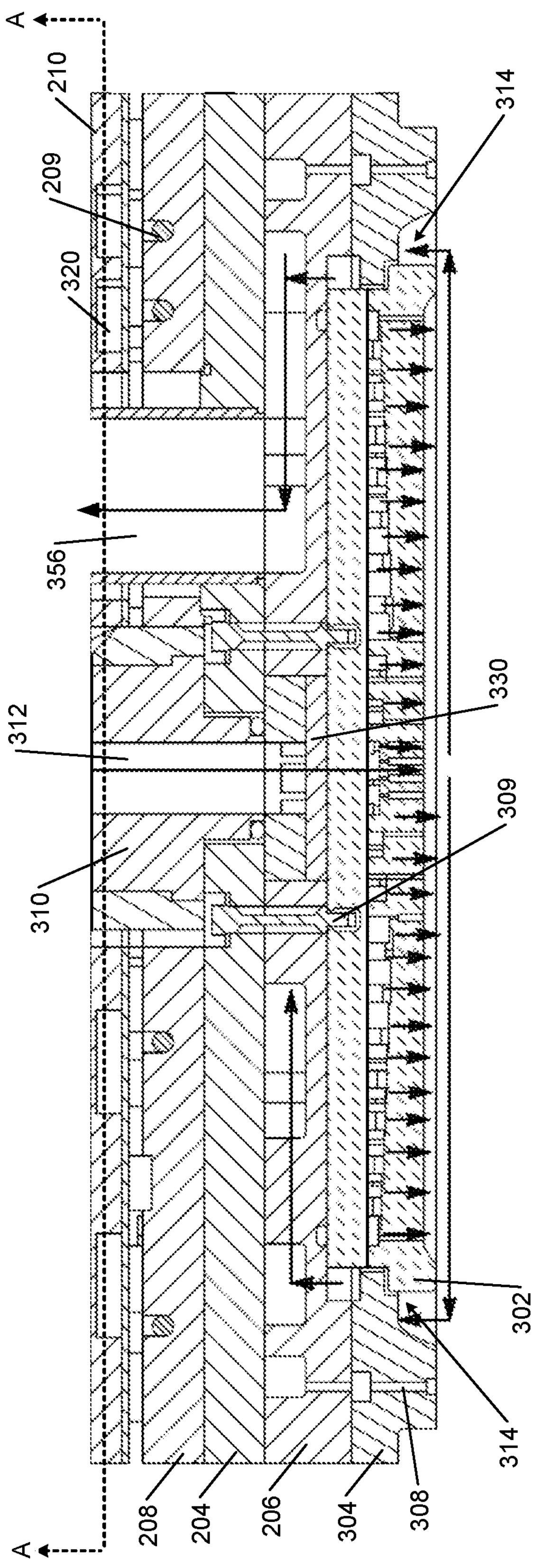

FIGS. 9A and 9B show cross-sections of the showerhead 300-2 across the entire diameter of the showerhead 300-2. In FIG. 9A, similar to the showerhead 300 shown in FIG. 4, the showerhead 300-2 comprises the stem portion 312 that can be attached to a top plate of a processing chamber (e.g., the processing chamber 102 shown in FIG. 1). The showerhead 300-2 includes the gas inlet in the stem portion 312 for supplying one or more gases into the processing chamber (e.g., supplied by the gas delivery system 130 shown in FIG. 1) via the through holes in the ceramic faceplate 302 as shown in FIG. 9B (e.g., also see FIG. 13C). The micro-volume of the exhaust gases from the processing chamber exits the showerhead 300-2 through the manifold 206 via the outlet 356 in the backing plate 204.

The metal ring 304 is integrated with the manifold 206 as described above with reference to FIG. 6C. The metal ring 304 provides the thermal break to the ceramic faceplate 302 at the OD of the ceramic faceplate 302 as shown at 314. In addition, the interface between the ID of the metal ring 304 and the OD of the ceramic faceplate 302 (i.e., between an inner edge of the metal ring 304 and an outer edge of the ceramic faceplate 302) provides the flow choke (also shown at 314). The flow choke provides uniformity control for the pumping of the micro-volume of exhaust gases through the manifold 206 in the backing plate 204.

The metal ring 304 includes the holes 308 described with reference to FIG. 3A for injecting an inert gas into the processing chamber to form a gas curtain surrounding a substrate during processing in the processing chamber as explained above with reference to FIG. 3A. The manifold 206 includes corresponding holes that align with the holes 308 in the metal ring 304 as shown in FIGS. 11A-12.

Figure 9C:
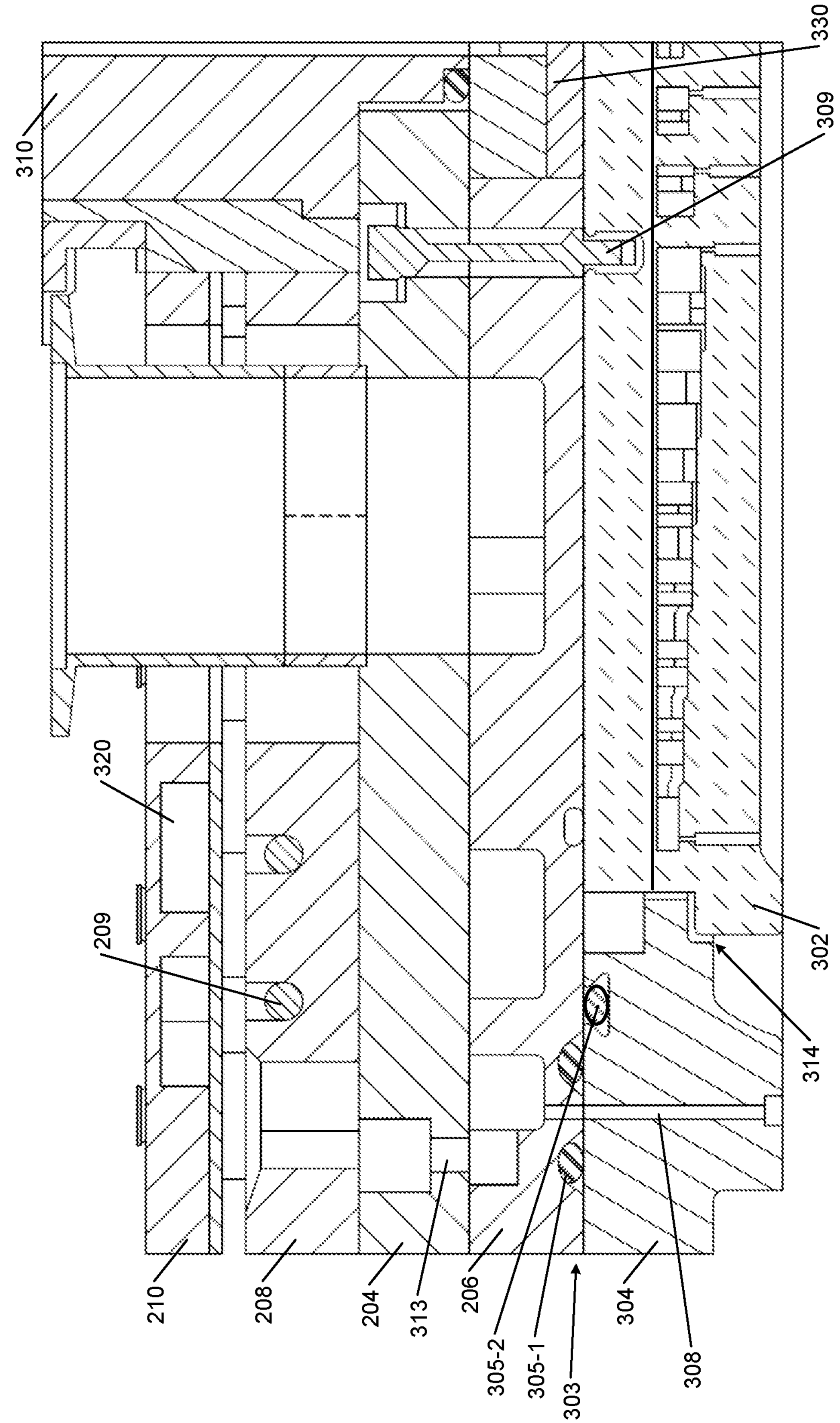
FIG. 9C shows an inlet in the backing plate for supplying an inert gas into the processing chamber.

FIG. 9C shows an inlet 313 for supplying an inert gas through the holes 308 into the processing chamber. The inlet 313 is provided in the manifold 206 through the backing plate 204. One end of the inlet 313 is connected to the holes 308 through an outer portion of the manifold 206. The other end of the inlet 313 is connected to a gas supply (e.g., element 130 shown in FIG. 1). For example, a gas line (not shown) from the gas supply can be connected to (inserted into) the inlet 313 to feed the inert gas to the inlet 313.

Thus, the manifold 206 serves a dual purpose. The inner portion of the manifold 206 that includes the exhaust holes 316 is used to exhaust the micro-volume of exhaust gases from the processing chamber through the outlet 356 in the backing plate 204. Additionally, the outer portion of the manifold 206, which is separate from the inner portion, is connected to the holes 308 extending from the metal ring 304 into the manifold 206 and is used to supply the inert gas to the processing chamber through the holes 308 in the metal ring 304.

Figure 10:
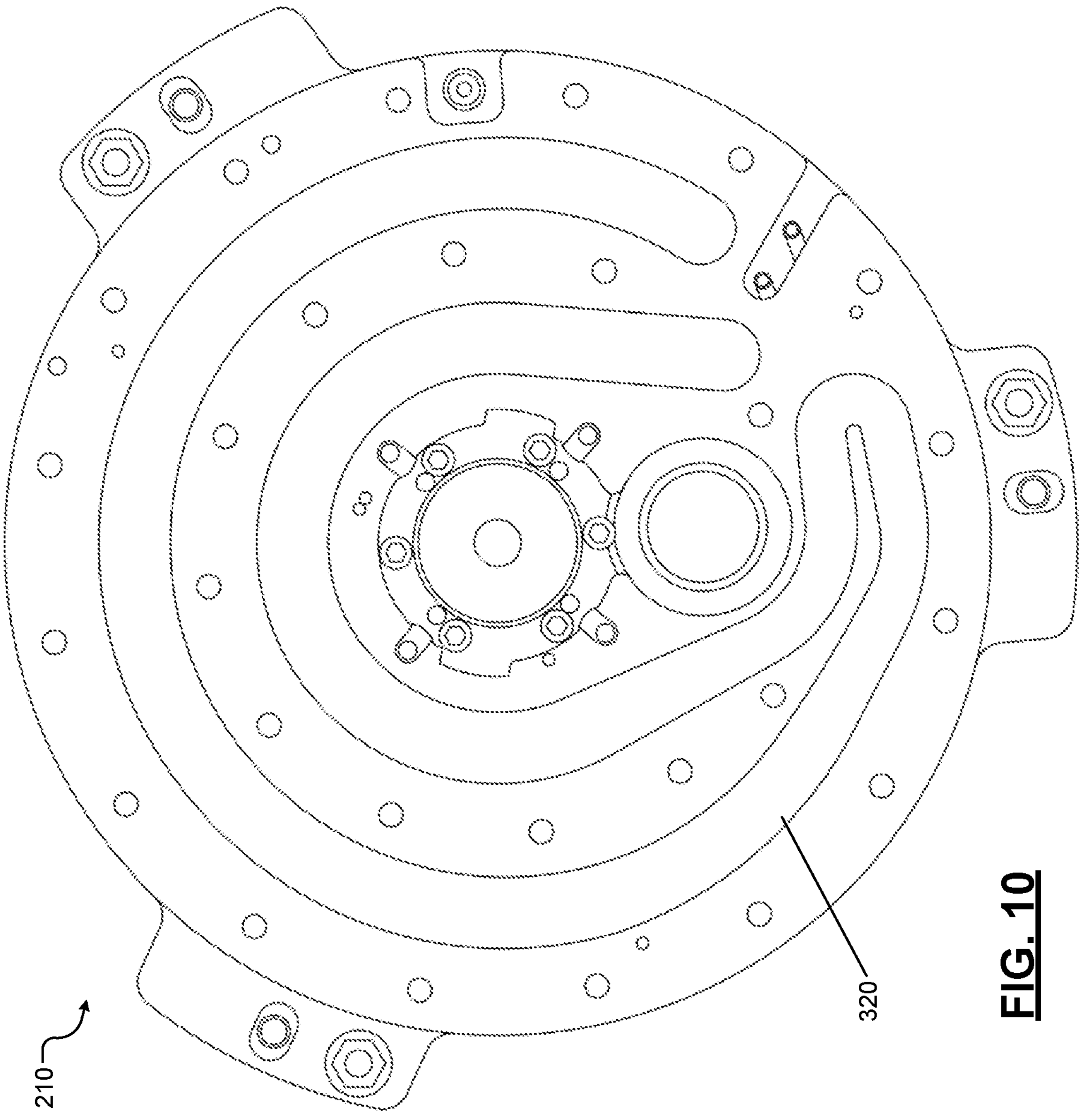
FIG. 10 shows an example of a cooling plate used with the showerheads of the present disclosure.

FIG. 10 shows a cross-section A-A of the cooling plate 210 referenced in FIG. 9B. The cooling plate 210 includes the cooling channel 320. FIG. 10 shows only an example of the cooling channel 320. The cooling channel 320 can be of any other shape and size. For example, while the cooling channel 320 is shown as being bifilar, the cooling channel 320 can be spiral shaped instead. Other shapes are contemplated. The fluid delivery system 140 shown in FIG. 1 supplies a coolant that is circulated through the cooling channel 320. The cooling plate 210 including the cooling channel 320 can be used with any of the showerheads 300, 300-1, and 300-2 designed according to the present disclosure.

Figure 11C:
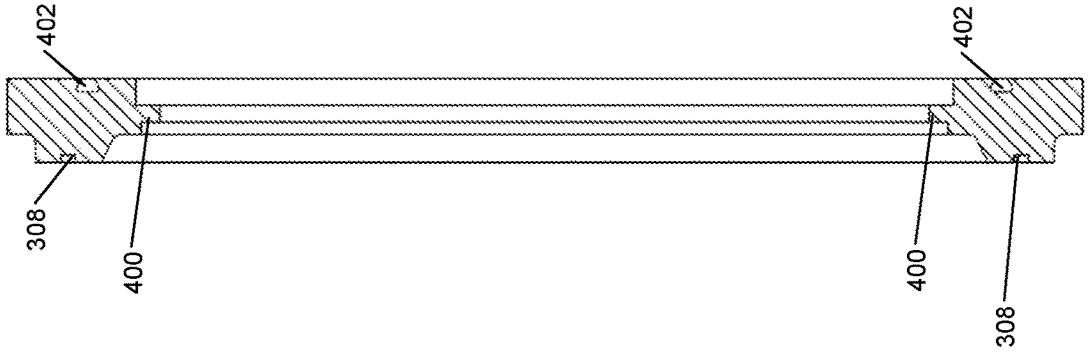
Figure 11B:
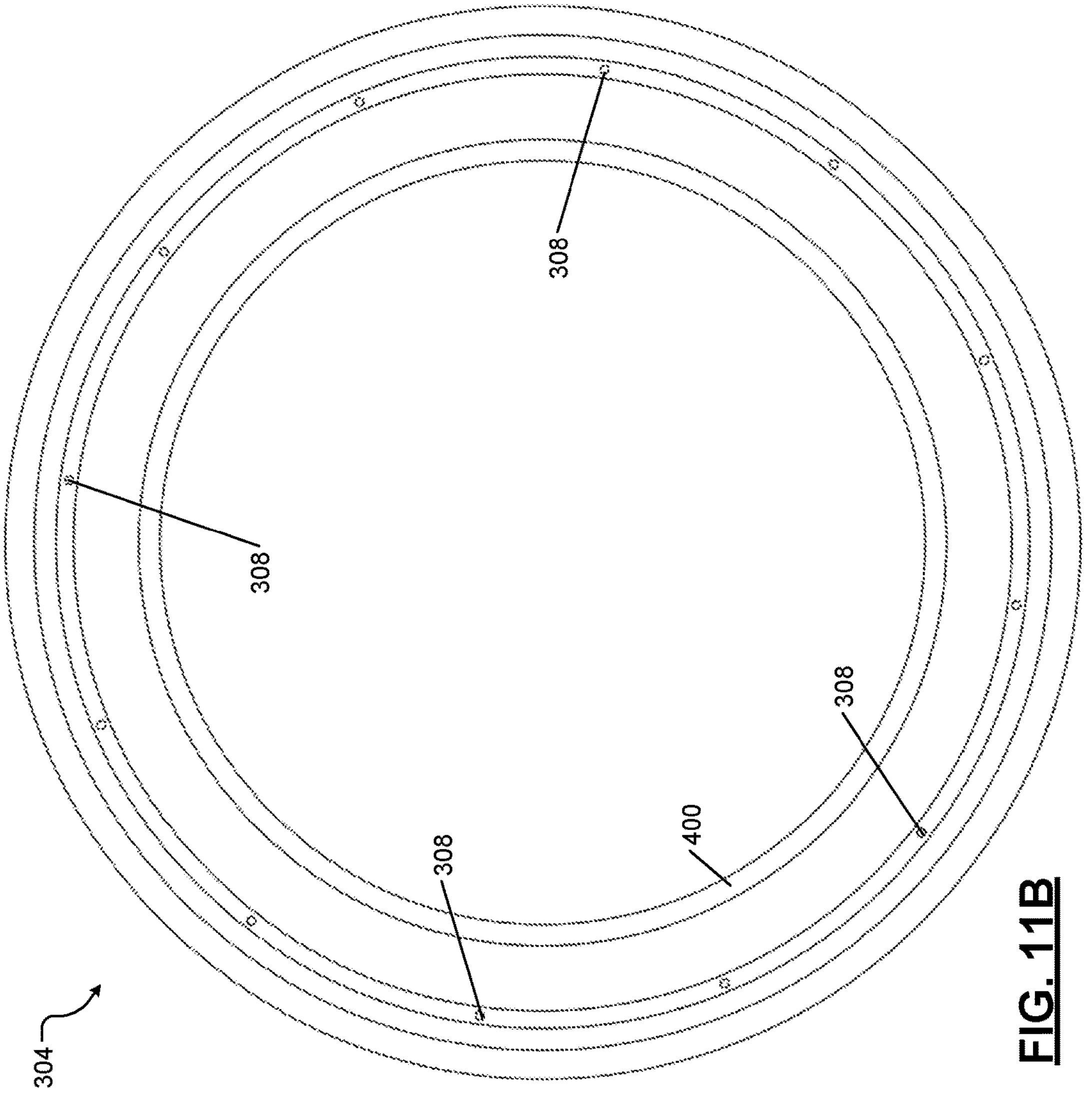
Figure 12:
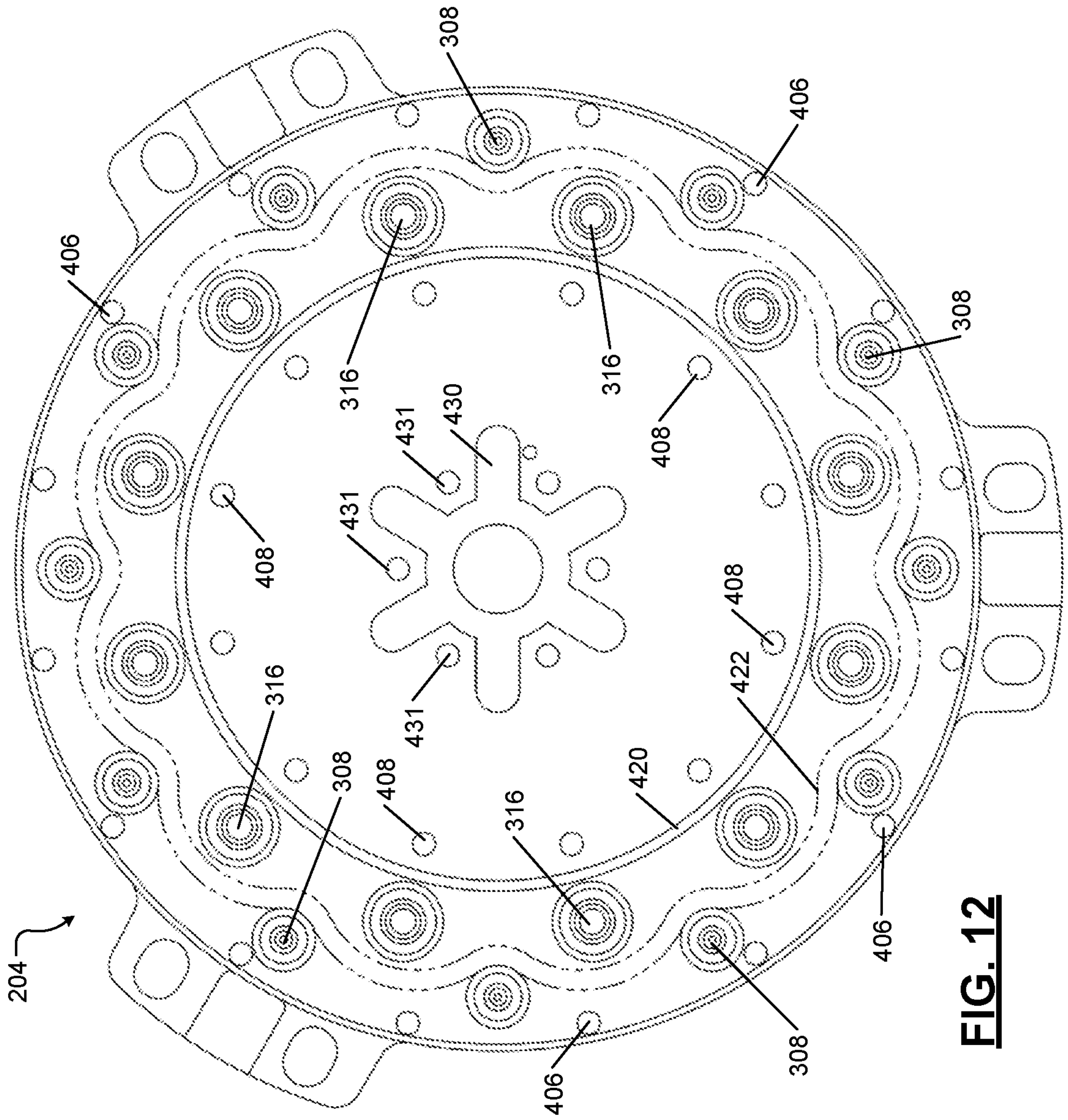
FIG. 12 shows an example of the backing plate used with the showerheads of the present disclosure.

FIGS. 11A-11C shows different views of the metal ring 304 in further detail. FIG. 11A shows a top view of the metal ring 304. FIG. 11B shows a bottom view of the metal ring 304. FIG. 11C shows a side view of the metal ring 304.

The metal ring 304 includes a flange 400 on the inner edge (i.e., along the ID) of the metal ring 304. The flange 400 extends radially inwards from inner edge (i.e., the ID) of the metal ring 304 towards the center of the metal ring 304. The flange 400 overhangs a flange (see element 454 shown in FIG. 13B) at the bottom of the ceramic faceplate 302 as shown at 314 in FIGS. 4-9B and as described below with reference to FIGS. 13A-13C.

The metal ring 304 includes a groove 402 for an O-ring on which the manifold 206 rests when the manifold 206 is arranged on the metal ring 304. The metal ring 304 includes the holes 308 described with reference to FIG. 3A for injecting an inert gas into the processing chamber to form a gas curtain surrounding a substrate during processing in the processing chamber as explained above with reference to FIG. 3A.

The metal ring 304 includes holes 404. Fasteners (similar to the fasteners 309 shown in FIG. 3A) used to fasten the manifold 206 to the metal ring 304 pass through the holes 404. The metal ring 304 can be used as a separate element independently of the manifold 206 in the showerheads 300 and 300-1. Alternatively, the metal ring 304 can be integrated with the manifold 206 in the showerhead 300-2. The metal ring 304 can be Ni-plated to resist corrosion from process gases.

FIG. 12 shows a bottom view of the manifold 206 in further detail. The manifold 206 includes an O-ring groove 420 and an O-ring seal spline 422. The manifold 206 includes a cutout (or slot) 430 at the center of the manifold 206. The slot 430 includes a plurality of radially extending segments (or channels) to supply gas from the gas inlet in the stem portion 312 (see FIG. 4) to the gas inlets of the ceramic faceplate 302 (see FIGS. 13A-13C).

While the showerheads 300, 300-1, and 300-2 include a single gas inlet in the stem portion 312, the ceramic faceplate 302 includes a plurality gas inlets (see FIGS. 13A-13C). The gas inlets of the ceramic faceplate 302 are arranged along a circumference of a circle. The adapter 330 (shown in FIG. 3A onwards) is arranged in the slot 430 and is attached to the ceramic faceplate 302 and to the manifold 206 adjacent to the slot 430 where the gas inlet in the stem portion 312 is attached to the manifold 206 through the backing plate 204. The adapter 330 includes a plurality of radially extending feed lines (or segments/channels) that mates with the segments of the slot 430 and feeds the plurality gas inlets of the ceramic faceplate 302, respectively. The adapter 330 splits the gas flow from the single gas inlet in the stem portion 312 into the plurality of gas inlets of the ceramic faceplate 302.

The manifold 206 includes holes 406 and 408 that respectively mate with the holes 404 in the metal ring 304 and holes 409 in the ceramic faceplate 302. Fasteners 309 (shown in FIG. 3A) used to fasten the manifold 206 to the metal ring 206 pass through the holes 406. Fasteners (similar to the fasteners 309 shown in FIG. 3A) used to fasten the manifold 206 to the ceramic faceplate 302 pass through the holes 408. The manifold 206 includes holes 431 (which mate with holes 433 in the ceramic faceplate 302 shown in FIGS. 13A-13C) for fasteners (e.g., bolts) that fasten the ceramic faceplate 302 to the manifold 206.

FIGS. 13A-13C show the ceramic faceplate 302 in further detail. FIGS. 13A and 13B show cross-sections of the ceramic faceplate 302. FIG. 13C shows a cross-section B-B of the ceramic faceplate 302 referenced in FIG. 13A. The ceramic faceplate 302 includes a base portion 450 and an upper portion 452 that has a smaller diameter than the base portion 450. The upper portion 452 extends vertically from the base portion 450, forming a flange 454. The flange 400 of the metal ring 304 overhangs the flange 454 of the ceramic faceplate 302.

The upper portion 452 of the ceramic faceplate 302 includes a plurality of inlets 500-1, 500-2, 500-3, 500-4, and so on (collectively inlets 500) through which a gas from the gas inlet in the stem portion 312 (shown in FIG. 4 onwards), received via the slot 430 at the bottom of the manifold 206, flows into various gas passages in the base portion 450 of the ceramic faceplate 302 (shown in FIG. 13C). The inlets 500 are arranged equal distance apart in a circular pattern although other arrangements and patterns may be used instead. For example only, six inlets are shown although any other number of inlets may be used instead. Specifically, the gas flows through the inlets 500 into inner and outer sections of a hole pattern 510 in the base portion 450 via various spoke like structures (trenches) 512 in the base portion 450 (shown in FIG. 13C).

The upper portion 452 of the ceramic faceplate 302 includes the holes 433, which mate with the holes 431 in the manifold 206 shown in FIG. 12, for fasteners that fasten the ceramic faceplate 302 to the manifold 206. The upper portion 452 of the ceramic faceplate 302 also includes holes 409, which mate with the holes 408 in the manifold 206. Fasteners (similar to the fasteners 309 shown in FIG. 3A) used to fasten the manifold 206 to the ceramic faceplate 302 pass through the holes 409. The upper portion 452 of the ceramic faceplate 302 also includes one or more holes 433 for temperature sensors (e.g., thermocouples).

In FIG. 13C, the hole pattern 510 is formed by distributing the holes around walls 514 of concentric channels in the base portion 450 of the ceramic faceplate 302. The gas from the inlets 500 is dispersed through the hole pattern 510 into the processing chamber (e.g., the processing chamber 102 shown in FIG. 1). Heat transfers from the base portion 450 of the ceramic faceplate 302 to the upper portion 452 of the ceramic faceplate 302 via the walls 514.

The foregoing description is merely illustrative in nature and is not intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims.

It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another are within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a pedestal, a gas flow system, etc.). These systems may be integrated with electronics for controlling their operation before, during, and after processing of a semiconductor wafer or substrate. The electronics may be referred to as the "controller," which may control various components or subparts of the system or systems.

The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software).

Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process.

In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control.

Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A showerhead for a processing chamber, the showerhead comprising:

a metal plate directly attached to the processing chamber, the metal plate including a manifold;

a ceramic faceplate directly attached to the metal plate and including a plurality of gas outlets on a substrate-facing surface; and a metal ring surrounding the ceramic faceplate and attached to the processing chamber.

2. The showerhead of claim 1 wherein the ceramic faceplate has a smaller diameter than the metal plate.

3. The showerhead of claim 1 wherein the ceramic faceplate has a smaller diameter than a diameter of the metal plate and an outer diameter of the metal ring.

4. The showerhead of claim 1 wherein an inner edge of the metal ring contacts an outer edge of the ceramic faceplate.

5. The showerhead of claim 1 wherein:

the ceramic faceplate includes a first flange extending radially outwardly from a base portion of the ceramic faceplate;

the metal ring includes a second flange extending radially inwardly from an inner edge of the metal ring; and the second flange overhangs on the first flange.

6. The showerhead of claim 1 wherein the metal ring is attached to the metal plate.

7. The showerhead of claim 1 wherein the metal ring is integrated with the metal plate.

8. The showerhead of claim 1 wherein:

the metal ring contacts the metal plate; and the metal ring includes a recess on a surface contacting the metal plate.

9. The showerhead of claim 1 wherein the metal plate includes a recess on a surface contacting the ceramic faceplate proximate to an outer edge of the ceramic faceplate.

10. The showerhead of claim 1 wherein:

the metal ring is attached to the metal plate and includes a first recess on an upper surface contacting the metal plate; and the metal plate includes a second recess on a lower surface contacting the ceramic faceplate proximate to an outer edge of the ceramic faceplate.

11. The showerhead of claim 1 wherein the manifold is in fluid communication with the processing chamber via an outer edge of the ceramic faceplate and an inner edge of the metal ring.

12. The showerhead of claim 1 wherein:

an interface between the metal ring and the ceramic faceplate controls flow of an exhaust gas from the processing chamber to the manifold.

13. The showerhead of claim 1 wherein:

the manifold is in fluid communication with the processing chamber; and the metal plate includes an outlet in fluid communication with the manifold to exhaust a gas from the processing chamber.

14. The showerhead of claim 1 wherein:

the manifold includes a plurality of through holes in fluid communication with the processing chamber.

15. The showerhead of claim 14 wherein:

the manifold receives an inert gas; and the inert gas flows via the plurality of through holes into the processing chamber.

16. The showerhead of claim 14 wherein the manifold receives an exhaust gas via the plurality of through holes from the processing chamber.

17. The showerhead of claim 1 wherein:

a first portion of the manifold exhausts a first gas from the processing chamber; and a second portion of the manifold supplies a second gas to the processing chamber.

18. The showerhead of claim 1 wherein:

the metal plate includes an outlet connected to a first portion of the manifold, and an inlet connected to a second portion of the manifold that is separate from the first portion;

a first set of holes in the first portion of the manifold to exhaust via the outlet a first gas received from the processing chamber through an interface between the ceramic faceplate and the metal ring; and a second set of holes in the second portion of the manifold to supply a second gas received from the inlet to the processing chamber.

19. The showerhead of claim 18 wherein the metal ring includes a plurality of through holes in fluid communication with the second set of holes in the second portion of the manifold and with the processing chamber.

20. The showerhead of claim 1 wherein the ceramic faceplate comprises:

a base portion including the gas outlets arranged around a plurality of concentric channels formed by walls extending vertically from the base portion; and an upper portion arranged on the base portion, the upper portion contacting the walls and including one or more inlets to receive a gas, wherein the gas outlets in the ceramic faceplate disperse the gas into the processing chamber.

21. The showerhead of claim 20 further comprising:

a gas inlet connected to the metal plate; and an adapter attached to the gas inlet and the one or more inlets of the ceramic faceplate.

22. The showerhead of claim 21 wherein:

the metal plate includes a slot; and the adapter is arranged in the slot and includes one or more segments that respectively couple to the one or more inlets of the ceramic faceplate.

23. The showerhead of claim 22 wherein:

the slot is arranged at a center of the metal plate; and the one or more segments of the adapter extend radially outwardly from the center.

24. The showerhead of claim 20 further comprising:

a gas inlet connected to a center of the metal plate, the metal plate including a slot at the center in fluid communication with the gas inlet; and an adapter arranged in the slot and including one or more segments that are in fluid communication with the gas inlet, that extend radially outwardly from the center, and that respectively couple to the one or more inlets of the ceramic faceplate.

25. The showerhead of claim 20 wherein the walls are plated with an anti-corrosive material.

26. The showerhead of claim 1 further comprising:

a first plate including a heater and arranged on the metal plate; and a second plate including a cooling channel and arranged on the first plate.

27. The showerhead of claim 1 wherein the metal ring is plated with an anti-corrosive material.

28. The showerhead of claim 1 wherein the metal plate and the metal ring are plated with an anti-corrosive material.

29. A system comprising:

the showerhead of claim 1; and a pedestal, wherein the metal ring contacts the pedestal.

30. The system of claim 29 wherein the metal ring isolates the ceramic faceplate from the pedestal.

31. The system of claim 29 further comprising:

a gas source to supply a gas to the showerhead, wherein the gas is dispersed into the processing chamber through the plurality of gas outlets of the ceramic faceplate of the showerhead.

32. The system of claim 29 further comprising a fluid delivery system to supply a coolant to at least one of the showerhead and the pedestal.

33. The system of claim 29 wherein at least one of the showerhead and the pedestal comprises one or more heaters.

34. The system of claim 29 further comprising a vacuum pump connected to the processing chamber.

35. The system of claim 29 further comprising a gas source connected to the processing chamber to supply an inert gas to the processing chamber.

36. The showerhead of claim 1 wherein an outer diameter of the metal ring is the same as a diameter of the metal plate.

37. A showerhead for a processing chamber, the showerhead comprising:

a metal plate attached to the processing chamber;

a ceramic faceplate attached to the metal plate and including a plurality of gas outlets on a substrate-facing surface; and a metal ring surrounding the ceramic faceplate and attached to the processing chamber, wherein an outer diameter of the metal ring is the same as a diameter of the metal plate.

* * * * *